(12) United States Patent
Yamazaki et al.

(10) Patent No.: US 7,047,461 B2
(45) Date of Patent: May 16, 2006

(54) SEMICONDUCTOR INTEGRATED CIRCUIT DEVICE WITH TEST DATA OUTPUT NODES FOR PARALLEL TEST RESULTS OUTPUT

(75) Inventors: Akira Yamazaki, Hyogo (JP); Takeshi Fujino, Hyogo (JP); Atsuo Mangyo, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 511 days.

(21) Appl. No.: 10/322,676

(22) Filed: Dec. 19, 2002

(65) Prior Publication Data

US 2003/0116763 A1 Jun. 26, 2003

(30) Foreign Application Priority Data

Dec. 20, 2001 (JP) ............................. 2001-387388

(51) Int. Cl.
*G11C 29/00* (2006.01)
(52) U.S. Cl. ....................................... 714/719; 365/201
(58) Field of Classification Search ................ 714/710, 714/711, 718–719; 365/201
See application file for complete search history.

(56) References Cited

U.S. PATENT DOCUMENTS 5,040,150 A * 8/1991 Naitoh et al. ............... 365/201
5,903,576 A * 5/1999 Yoshiba ...................... 714/720
5,991,232 A * 11/1999 Matsumura et al. ......... 365/233
6,324,666 B1 * 11/2001 Nakamoto ................... 714/736
6,418,067 B1    7/2002 Watanabe et al. ........... 365/200
6,701,470 B1 * 3/2004 Mullarkey et al. .......... 714/718
6,754,865 B1 * 6/2004 Haraguchi ................... 714/736

FOREIGN PATENT DOCUMENTS

JP          11-219600          8/1999

* cited by examiner

*Primary Examiner*—Albert Decady
*Assistant Examiner*—Cynthia Britt

(74) *Attorney, Agent, or Firm*—McDermott Will & Emery LLP

(57) ABSTRACT

A semiconductor integrated circuit device includes test data output nodes arranged in a width of a plurality of bits and an internal data bus, greater in bit width than the test data output nodes, for transferring internal data. A predetermined number of bits of the internal data on the internal data bus are compared with bits of test expected value data equal in bit width to the test data output nodes for each bit. The predetermined number of bits of the internal data are selected in accordance with a test address signal. The bits selected is compared with the respective bits of the test expected valued data. Data indicating respective comparison results are output to the test data output nodes in parallel.

9 Claims, 19 Drawing Sheets

F I G. 7
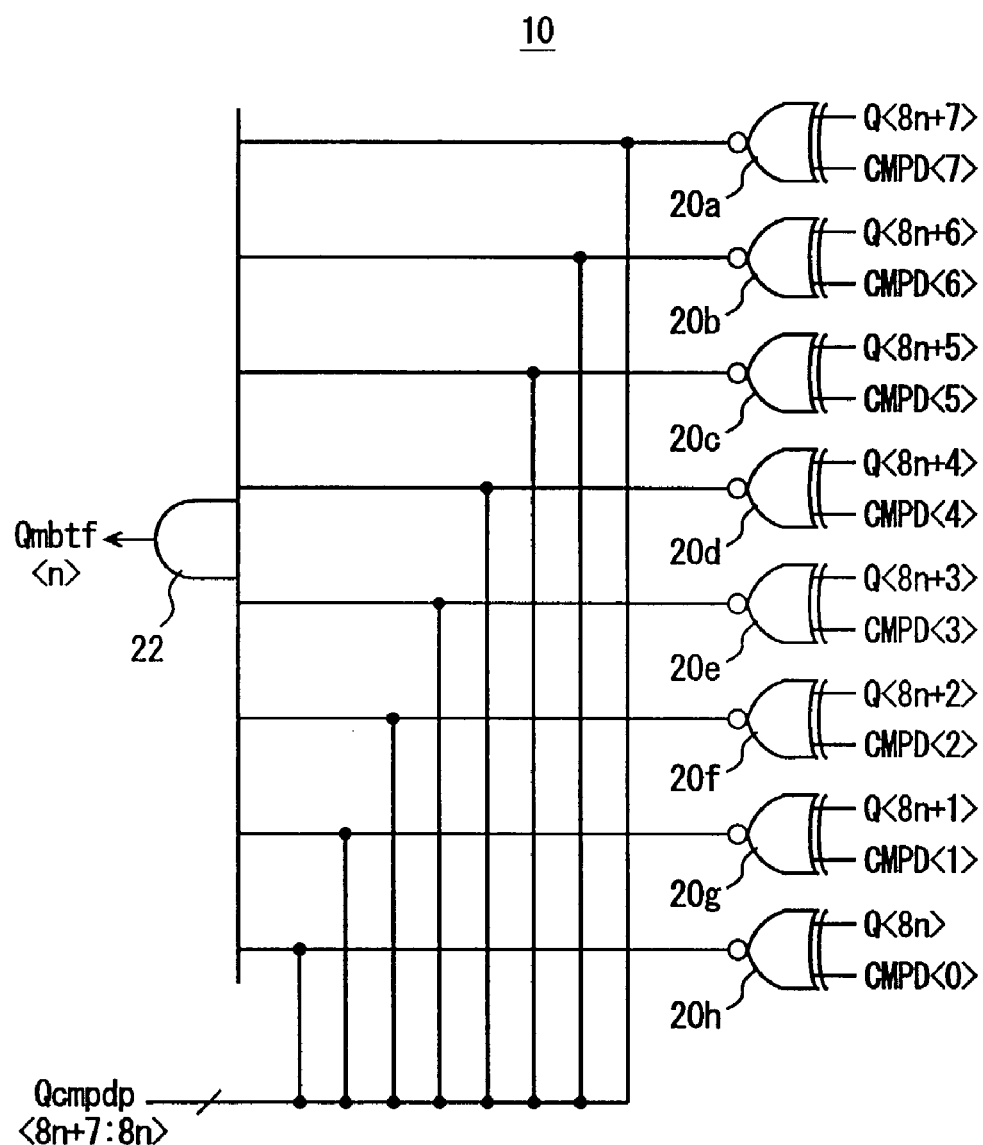

F I G. 9  PRIOR ART

| SIGNAL NAME | FUNCTION |
|---|---|
| CLK | CLOCK SIGNAL |
| CKE | CLOCK ENABLE SIGNAL |
| /ACT | ROW ACTIVATION SIGNAL |
| /PRE | ROW DEACTIVATION SIGNAL |
| /REFA | AUTO-REFRESH INSTRUCTION SIGNAL |
| /RE | READ OPERATION INSTRUCTION SIGNAL |
| /WR | WRITE OPERATION INSTRUCTION SIGNAL |
| RA<12:0> | ROW ADDRESS SIGNAL |
| CA<3:0> | COLUMN ADDRESS SIGNAL |
| RAsp | SPARE ROW SPACE ADDRESSING ADDRESS SIGNAL |
| CAsp | SPARE COLUMN SPACE ADDRESSING ADDRESS SIGNAL |
| Q<127:0> | READ DATA |
| D<127:0> | WRITE DATA |

F I G. 1 0  PRIOR ART

| SIGNAL NAME | FUNCTION |
|---|---|
| TCLK | CLOCK SIGNAL |
| TCKE | CLOCK ENABLE SIGNAL |
| /CS | CHIP SELECT SIGNAL |
| /RAS | ROW ADDRESS STROBE SIGNAL |
| /CAS | COLUMN ADDRESS STROBE SIGNAL |
| /WE | WRITE OPERATION INSTRUCTION SIGNAL |
| AD<12:0> | ROW/COLUMN ADDRESS |
| ADsp | SPARE SPACE ADDRESSING ADDRESS SIGNAL |
| TQ<7:0> | READ DATA OUTPUT SIGNAL |
| TQmbt | MULTI-BIT TEST RESULT OUTPUT SIGNAL |
| TD<7:0> | WRITE DATA SIGNAL |

FIG. 11 PRIOR ART

| MNEMONIC | TIC CONTROL SIGNALS | | | | DRAM CONTROL SIGNALS | | | | | |
|---|---|---|---|---|---|---|---|---|---|---|
| | /CS | /RAS | /CAS | /WE | /ACT | /PRE | /REFA | /RE | /WR |
| DSEL | H | — | — | — | H | H | H | H | H |
| NOP | L | H | H | H | H | H | H | H | H |
| ACT | L | L | H | H | L | H | H | H | H |
| PRE | L | L | H | L | H | L | H | H | H |
| REFA | L | L | L | H | H | H | L | H | H |
| RE | L | H | L | L | H | H | H | L | H |
| WE | L | H | L | L | H | H | H | H | L |

F I G. 1 8 PRIOR ART

SEMICONDUCTOR INTEGRATED CIRCUIT DEVICE WITH TEST DATA OUTPUT NODES FOR PARALLEL TEST RESULTS OUTPUT

BACKGROUND OF THE INVENTION

1. Field of the Invention

The present invention relates to a semiconductor integrated circuit device, referred to as "system LSI", having a memory and a logic integrated on the same semiconductor substrate. The present invention particularly relates to a test interface circuit for directly accessing a memory externally for testing the memory.

2. Description of the Background Art

In recent years, a DRAM embedded system LSI having a DRAM (dynamic random access memory) and a logic device or a microprocessor integrated on the same semiconductor substrate have been spreading. This DRAM embedded system LSI has the following advantages over a conventional system having a DRAM and a logic device or microprocessor individually mounted on a printed circuit board using soldering or the like.

(1) Since there is no restriction on pin terminals, it is possible to increase the width of the data bus between DRAM and the logic device, to increase data transfer rate and to improve system performance accordingly;

(2) The data bus formed between DRAM and the logic device is on-chip interconnection lines and is smaller in capacitance than an on-board wiring. It is, therefore, possible to decrease operating current in data transfer and to transfer data at high speed; and (3) Since the system is constituted into a single package, there is no need to provide a data bus wiring and a control signal wiring externally. It is, therefore, possible to decrease the area of the system occupying on the printed circuit board and to make the system small in size.

FIG. 8 is a schematic diagram showing one example of the configuration of a conventional DRAM embedded system LSI. In FIG. 8, DRAM embedded system LSI 500 includes a logic device 502 which performs a predetermined operational processing, a DRAM macro 504 which stores at least data required by logic device 502, and a logic external bus 508 which connects logic device 502 to an external device through a pad group 518.

Logic device 502 may be a dedicated logic device which performs a predetermined operational processing or may be a microprocessor. It suffices that logic device 502 is a circuit device which performs a processing using data stored in DRAM macro 504.

DRAM macro 504 includes a DRAM core 510 which stores data, a test interface circuit (TIC) 512 for directly accessing DRAM core 510 for testing DRAM core 510 externally, and a select circuit 517 which selects one of an internal logic bus 506 of logic device 502 and an internal test bus 516 of test interface circuit 512 for connection to an internal memory bus 515 connected to DRAM core 510. Test interface circuit 512 is coupled to pad group 518 through an external test bus 514.

Each of buses 506, 508, 514, 515 and 516 includes signal lines for transmitting control signals, address signals and data. Since there is no restriction condition due to pin terminals, it is possible to sufficiently increase the width of each of internal logic bus 506, internal memory bus 515 and internal test bus 516. While data read from DRAM core 510 is directly transferred to test interface circuit 512 and logic device 502 without passing through select circuit 517, this internal read data transfer path is not shown in FIG. 8, for simplification of the drawing.

FIG. 9 shows the signals transferred by DRAM core 510 in a list form. In FIG. 9, DRAM core 510 receives, as operation control signals, a clock signal CLK, a clock enable signal CKE which sets an internal clock signal in DRAM core 510 valid/invalid, a row activation signal /ACT which activates internal row select operation, a row deactivation signal /PRE which drives a selected row to an unselected state, an auto-refresh instructing signal /REFA which instructs the refreshing of memory cell data in DRAM core 510, a read operation instructing signal /RE which instructs data read and a write operation instructing signal /WR which instructs data write operation.

Further, DRAM core 510 receives row address signal RA<12:0> of 13 bits and column address signal CA<3:0> of 4 bits for addressing memory cells, a spare row space addressing address signal RAsp for addressing a spare memory cell row, and a spare column space addressing address signal CAsp for addressing a spare column. Spare row space addressing address signal RAsp and spare column space addressing address signal CAsp are used to access a spare memory cell in DRAM core 510, for determining pass/fail of the spare memory cell is in a test performed before defective address fuse programming.

These spare row space addressing address signal RAsp and spare column space addressing address signal CAsp designate a spare memory cell space when set at H level and designate a normal memory cell space when set at L level.

Write data D<127:0> of 128 bits are applied to DRAM core 510 and read data Q<127:0> of 128 bits are outputted from DRAM core 510.

As shown in FIG. 9, DRAM core 510 has a greater number of input/output signals than a general purpose DRAM of a discrete device. Test interface circuit 512 transfers signals/data as shown in FIG. 9 to DRAM core 510 even in test mode of operation. Therefore, when the signals/data shown in FIG. 9 are transferred between test interface circuit 512 and the external tester through external test bus 514 via pad group 518, the number of the pins of the external tester becomes greater than that of these signals/data lines, and test cannot be performed. Further, even if test may be possible, the number of devices which can be measured simultaneously decreases to increase test cost because of the large number of signal/data lines from one device under test.

Test interface circuit 512 is provided to decrease the number of necessary pins during a test, to directly access DRAM core 510 externally and to readily test DRAM core 510.

FIG. 10 shows, in a list form, external signals applied to test interface circuit 512 shown in FIG. 8. The signals shown in FIG. 10 are transferred between the external tester and test interface circuit 512 through external test bus 514 shown in FIG. 8.

In FIG. 10, a test clock signal TCLK and a test clock enable signal TCKE are applied to test interface circuit 512. These test clock signal TCLK and test clock enable signal TCKE are used, respectively, in place of clock signal CLK and clock enable signal CKE used in a normal operation mode.

Further, a chip select signal /CS, a row address strobe signal /RAS, a column address strobe signal /CAS and a write operation instructing signal /WE are applied to test interface circuit 512. According to combination of logic levels of these control signals ICS, /RAS, /CAS and /WE at, for example, the rising edge of the test clock signal, the operation mode of DRAM core 510 is designated.

Test interface circuit 512 decodes these external control signals, and selectively activates row activation signal /ACT, row deactivation signal /PRE, auto-refresh instructing signal /RFEA, read operation instructing signal /RE and write operation instructing signal /WR shown in FIG. 9 in accordance with the result of decoding.

Address signal AD<12:0> of 13 bits and a spare space addressing address signal ADsp are applied, as address signals, to this test interface circuit 512. A row address and a column address are applied through the same pads (terminals) in time division multiplexedly and spare space addressing address signal ADsp is applied to a spare row and a spare column in time division multiplexedly.

In addition, test write data TD<7:0> of 8 bits, test read data TQ<7:0> of 8 bits and a multi-bit test result output signal TQmbt of 1 bit are transferred, as data, between the external tester and test interface circuit 512. When test date is written, test interface circuit 512 expands the bit width of test data TD<7:0> of 8 bits to data of 128 bits for application to DRAM core 510 through select circuit 517.

When test data is read, test interface circuit 512 sequentially outputs the data of 128 bits read from DRAM core 510 on an 8 bit-by-8 bit basis.

Multi-bit test result output signal TQmbt is a signal which indicates a multi-bit test result with respect to the test read data of 128 bits.

FIG. 11 shows the relationship between the external control signals (TIC control signals) applied to test interface circuit 512 and the DRAM control signals applied to DRAM core 510 in the form of a truth table.

In FIG. 11, the unselected state (DSEL) of DRAM macro 504 is set when chip select signal /CS is at H level. In this state, irrespectively of the logic levels of remaining control signals /RAS, /CAS and /WE, DRAM core 510 is kept in an unselected state.

When chip select signal ICS is set at L level, an operation mode for DRAM core 510 is designated.

In case of a state NOP which indicates no operation mode, control signals /RAS, /CAS and /WE are all set at H level. In this case, the control signals applied to DRAM core 510 are all maintained at H level and a new operation mode is not designated to DRAM core 510. Normally, when this signal NOP is applied, DRAM core 510 is kept in a standby state.

When chip select signal /CS and row address strobe signal /RAS are both set at L level and column address strobe signal /CAS and write operation instructing signal /WE are both set at H level, a state ACT instructing array activation is designated. In this state, row activation signal /ACT is set in an active state of L level for DRAM core 510. The remaining DRAM control signals are kept in an inactive state of H level. Here, the logic levels of the TIC control signals for test interface circuit 512 are determined at the rising edge or falling edge of test clock signal TCLK.

When chip select signal ICS, row address strobe signal /RAS and write operation instructing signal /WE are set at L level and column address strobe signal /CAS is kept at H level, a state PRE instructing precharge operation is designated. In this state, row deactivation signal /PRE is set at L level as the DRAM control signal and DRAM core 510 has the internal state returned to a precharge state.

When chip select signal /CS, row address strobe signal /RAS and column address strobe signal /CAS are set at L level and write operation instructing signal /WE is set at H level, a state REFA instructing refresh operation is designated. In this case, auto-refresh instructing signal /REFA among the DRAM control signals is set at L level and refresh is executed in DRAM core 510.

If chip select signal /CS and column address strobe signal /CAS are both set at L level and row address strobe signal /RAS and write operation instructing signal /WE are both set at H level, then a state RE instructing data read is designated. In this case, read operation instructing signal /RE among the DRAM control signals is set in an active state of L level and the remaining control signals are set at H level.

If chip select signal /CS, column address strobe signal /CAS and write operation instructing signal /WE are set at L level and row address strobe signal /RAS and is set at H level, then a state WE instructing data write is designated. In this state, write operation instructing signal /WR among the DRAM control signals is set at L level.

Test interface circuit 512 converts the TIC control signals into DRAM control signals in accordance with the truth table shown in FIG. 11. Test interface circuit 512 performs address multiplexing, conversion of data bit width and conversion of the control signals, whereby the number of pin terminals which are used when the external tester accesses DRAM core 510 and performs a test operation, can be greatly decreased. Further, since the control signals applied to test interface circuit 512 are the same as those used in a normal clock synchronous type DRAM, the DRAM core 510 can be tested using a tester for a standard clock synchronous DRAM.

FIG. 12 is a schematic diagram showing the configurations of DRAM core 510 and test interface circuit (TIC) 512 shown in FIG. 8. In FIG. 12, for simplification of the drawing, select circuit 517, which is provided between DRAM core 510 and test interface circuit 512, is not shown.

In FIG. 12, DRAM core 510 includes DRAM arrays 550$e$ and 550$w$ each having a plurality of memory cells arranged in rows and columns, and a decoder 552 which selects a memory cell from DRAM arrays 550$e$ and 550$w$ in accordance with an address signal.

In FIG. 12, each of DRAM arrays 550$e$ and 550$w$ has a storage capacity of, for example, 8 M bits. In each of DRAM arrays 550$e$ and 550$w$, a spare row and a spare column for repairing a fail memory cell are arranged. Decoder 552 includes a row decoder which selects a memory cell row from these DRAM arrays 550$e$ and 550$w$ and a column decoder which selects a memory cell column therefrom.

DRAM core 510 also includes a DRAM data path 556$e$ which inputs and outputs data to and from DRAM array 550$e$, a DRAM data path 556$w$ which inputs and outputs data to and from DRAM array 550$w$ and a DRAM control circuit 558 which controls the internal operation of DRAM core 510.

Each of DRAM data paths 556$e$ and 556$w$ includes a write driver which transmits internal written data to corresponding DRAM array 550$e$ or 550$w$, and a preamplifier which amplifies memory cell data read from corresponding DRAM array 550$e$ or 550$w$. DRAM data path 556$e$ transfers written data WD<127:64> through a write data bus 551$e$ having a 64 bit width and receives 64 bit internal read data RD<127:64> transferred from DRAM array 550$e$ through an internal read data bus 553$e$.

While the configuration of DRAM data path 556$e$ will be described later in detail, DRAM data path 556$e$ transfers spare write data SWD<1> through a spare write data line 557$e$ and receives read data SRD<1> from a spare memory cell through a spare read data line 559$e$ when a fail column is repaired. This is because the spare column is simultaneously selected with a normal column in DRAM array 550$e$.

Likewise, DRAM data path 556$w$ transfers internal write data WD<63:0> to DRAM array 550$w$ through an internal write data bus 551*w* having a 64 bit width and receives 64 bit internal read data RD<63:0> from DRAM array 550*w* through an internal read data bus 553*w*. In addition, when a fail column is repaired, this DRAM data path 550*w* receives read data SRD<1> read from the spare column through a spare read data line 559*w* and transfers data SWD<0> written to the spare column to DRAM array 550*w* through a spare write data line 557*w*.

When a fail column is repaired, DRAM data path 556*e* substitutes replaces spare write data line 557*e* for a corresponding internal write data line of internal write data bus 551*e* and substitutes spare read data line 559*e* for a corresponding internal read data line of internal read data bus 553*e* in a normal operation mode. Likewise, DRAM data path 556*w* replaces a corresponding internal read data line of internal read data bus 553*w* with spare read data line 559*w* and replaces a corresponding internal write data line of internal write data bus 551*w* with spare write data line 557*w* in a normal operation mode.

On the other hand, in a test mode for repair determination performed before fail address programming for repairing a fail column, the normal memory cells and the spare memory cell are tested and it is examined whether the spare memory cell is normal or pass. In this memory test for repair determination, in DRAM data paths 556*e* and 556*w*, spare data lines do not replace the normal data lines, but transfer data to test interface circuit 512, and transfer data with test interface circuit 512.

Test interface circuit 512 includes TIC data paths 560*e* and 560*w* which are provided corresponding to DRAM data paths 556*e* and 556*w*, respectively, and a TIC control circuit 562 which transfers test data TD<7:0> and TQ<7:0> and multi-bit test result indication signal TQmbt with the external tester.

Although TIC control circuit 562 receives the address signals and the control signals for designating an operation mode as shown in FIG. 10 from the external tester, these signals are not shown in FIG. 12 for simplification of the drawing.

When test data is written, TIC data paths 560*e* and 560*w* expand test data TD<7:0> of 8 bits to test data of 64 bits and transfer the expanded test data to DRAM data paths 556*e* and 556*w* through corresponding data buses 561*e* and 561*w*, respectively.

When data is read, TIC data paths 560*e* and 560*w* receive read data of 64 bits from DRAM data paths 556*e* and 556*w* through data buses 563*e* and 563*w*, respectively.

That is, TIC data path 560*e* receives data Q<127:64> of 64 bits from DRAM data path 556*e* through data bus 563*e*, and also receives spare read data SRD<1> transmitted from spare internal read data line 559*e* through DRAM data path 556*e* as spare data SQ<1> through spare read data line 569*e*. Further, this TIC data path 560*e* transfers write data D<127:64> of 64 bits to DRAM data path 556*e* through internal write data bus 561*e* and also transfers spare write data SD<1> to spare write data line 557*e* through a spare write data line 567*c*.

Likewise, TIC data path 560*w* receives internal read data Q<63:0> from DRAM data path 556*w* through read data bus 563*w* and also receives spare read data SQ<0> through a spare data line 569*w*. In addition, TIC data path 560*w* transfers data D<63:0> of 64 bits to DRAM data path 556*w* through write data bus 561*w* and also transfers spare write data SD<0> to DRAM data path 556*w* through a spare write data line 567*w*.

TIC control circuit 562 sequentially outputs data of a total of 128 bits applied to TIC data paths 560*e* and 560*w* on an 8 bit-by-8 bit basis as test data TQ<7:0>. Further, TIC control circuit 562 transfers signal TQmbt indicating the multi-bit test result of simultaneously read data of 128 bits through a multi-bit signal line 573. If this multi-bit test result indication signal TQmbt indicates non-coincidence, the external tester specifies a fail memory cell in accordance with test read data TQ<7:0> and expected value data.

FIG. 13 is a schematic diagram showing the configuration of a main portion of DRAM arrays 550*e* and 550*w*. Since DRAM arrays 550*e* and 550*w* have the same configuration, FIG. 13 representatively shows one DRAM array 550.

In FIG. 13, DRAM array 550 includes normal memory cells NMC arranged in rows and columns and spare memory cells SMC for repairing a fail normal memory cell. Spare memory cells SMC are also arranged in rows and columns. Normal memory cells NMC and spare memory cells SMC are arranged being aligned in a row direction. It is noted, however, that FIG. 13 representatively shows one normal memory cell NMC and one spare memory cell SMC.

A word line WL is arranged corresponding to normal memory cells NMC and spare memory cells SMC aligned in a row direction. A word line select signal is transmitted to word line WL from a row decoder not shown. A pair of normal bit lines NBL and /NBL are arranged corresponding to each column of normal memory cells NMC. Likewise, a pair of spare bit lines SBL and /SBL are arranged corresponding to each column of spare memory cells SMC. In FIG. 13, only bit lines NBL and SBL are shown.

Internal read data lines RDL0 to RDL63 and internal write data lines WDL0 to WDL63 are arranged extending in a column direction, one for each predetermined number of bit line pairs. A spare read data line SRDL and an internal spare write data line SWDL are arranged extending in the column direction in correspondence to spare memory cells SMC.

To select a memory cell column, a write column select line WCSL which transmits a write column select signal in data write mode and a read column select line RCSL which transmits a column select signal in data read mode are arranged extending in the row direction. Write column select line WCSL makes a write column select gate WSG arranged on normal bit line NBL conductive to connect normal bit line NBL to corresponding internal write data line WDL. Further, when data is read, normal bit line NBL is connected to internal read data line RDL through a read column select gate RSG in accordance with a signal on read column select line RCSL. In FIG. 13, read column select gate RSG and write column select gate WSG provided corresponding to internal read data line RDL0 and internal write data line WDL0, respectively are representatively shown.

Normally, read column select gate RSG has a differential amplification gate structure. When selected, read column select gate RSG reads a signal on the corresponding bit line (pair) to the internal read data lines (pair) by MOS transistors (insulated gate field effect transistors) having the gates connected to the corresponding bit lines.

Likewise, a spare write column select gate SWSG which connects spare bit line SBL to spare write data line SWDL in accordance with a select signal on write column select line WCSL, and a read column select gate SRSG which connects spare bit line SBL to internal spare read data line SRDL in accordance with a column select signal on read column select line RCSL are provided corresponding to spare bit line SBL.

Since column select lines WCSL and RCSL are arranged extending in the row direction, a normal memory cell and a spare memory cell are always selected simultaneously and memory cell data are transmitted to internal read data lines RDL0 to RDL63 and spare read data line SRDL or to internal write data lines WDL0 to WDL63 and spare write data line SWDL.

FIG. 14 is a schematic diagram showing the arrangement of sense amplifiers for one write data line and one read data line. In FIG. 14, a sense amplifier group SAG which includes 16 sense amplifiers are arranged for internal read data line RDL and internal write data line WDL. One of the 16 sense amplifiers included in sense amplifier group SAG is selected by column address CA<3:0> of 4 bits. Accordingly, 16 columns of spare memory cells SMC are provided per spare data line. Each sense amplifier is arranged to correspond to each bit line pair. When activated, the sense amplifier senses, amplifies and latches memory cell data on a corresponding bit line.

Normally, this DRAM array 550 is divided into 16 row blocks. In each row block, 512 word lines are arranged. One word line is selected in one row block by row address RA<12:0> of 13 bits. To repair a fail memory cell row, a spare row is also arranged. As the arrangement of this spare row, a spare word line may be arranged in each row block or spare word lines may be arranged collectively in a specific row block.

FIG. 15 is a schematic diagram showing correspondence in fail column repair. In FIG. 15, one DRAM array is divided into a plurality of row blocks. In FIG. 15, two row blocks RBi and RBj are shown. In the DRAM array, internal read data lines RDL0 to RDL63, internal write data lines WDL0 to WDL63, spare read data line SRDDL and spare write data line SWDL are arranged, commonly to the row blocks, extending in the column direction.

In row block RBi, if a memory cell related to internal read data line RDLa and internal write data line WDLa is a fail cell, internal read data line RDLa and internal write data line WDLa are replaced by spare read and write data lines SRDL and SWDL, respectively. In row block RBj, if a memory cell related to internal read data line RDLb and internal write data line WDLb is a fail cell, internal read data line RDLb and internal write data line WDLb are replaced by spare read data lines SRDL and spare write data line SWDL, respectively.

Therefore, when a row block is specified, the internal read data line or internal write data line to be replaced is uniquely determined. By repairing a fail column in units of internal data lines, even if the column select lines, i.e., the write column select line and read column select line are extended in the row direction and a spare memory cell and a normal memory cell are selected simultaneously, it is possible to accurately perform redundancy replacement to repair a fail memory cell.

FIG. 16 is a schematic diagram showing the configuration of DRAM data paths 556e and 556w shown in FIG. 12. Since DRAM read data paths 556e and 556w have the same configuration, DRAM read data path 556 is shown in FIG. 16 as a representative of DRAM data paths 556e and 556w.

In FIG. 16, DRAM read data path 556 includes preamplifiers PA0 to PA63 provided corresponding to internal read data lines RDL0 to RDL63, respectively, write drivers WV0 to WV63 arranged corresponding to internal write data lines WDL0 to WDL63, respectively, a spare preamplifier SPA arranged corresponding to spare read data line SRDL, and a spare word driver SWV arranged corresponding to spare write data line SWDL.

These preamplifiers PA0 to PA63 and SPA are simultaneously activated by a control circuit (TIC control circuit) which is not shown in FIG. 16. Write drivers WV0 to WV63 and SWV are also activated concurrently by the control circuit (TIC control circuit), not shown, in data writing. If no redundancy replacement is performed, spare write driver SWV may be kept inactive.

DRAM read data path 556 further includes a redundancy control circuit CRC which generates a redundancy replacement select signal in accordance with a spare column check test mode instructing signal SPCC and a row block address RB, multiplexers (MUX) MX0 to MX63, provided corresponding to preamplifiers PA0 to PA63, for selecting one of each respective output data from corresponding preamplifiers PA0 to PA63 and output data from spare preamplifier SPA in accordance with select signals RSEL0 to RSEL63 from redundancy control circuit CRC, read data latches RLH0 to RLH63 which latch and transfer the output data of multiplexers MX0 to MX63, respectively, and output buffers OBF0 to OBF63 which buffer the output data of read data latches RLH0 to RLH63 and generate read data Q0 to Q63, respectively.

This spare column check test mode instructing signal SPCC is activated in a memory test for spare determination performed before the programming of a fail memory cell address.

When spare column check test mode instructing signal SPCC is deactivated, redundancy control circuit CRC generates read select signals RSEL0 to RSEL63 so as to replace a fail read data line programmed for each row block by a spare read data line in accordance with row block address RB.

When spare column check test mode instructing signal SPCC is activated, redundancy control circuit CRC sets all of select signals RSEL0 to RSEL63 into an inactive state to cause multiplexers MX0 to MX63 to select the output data of corresponding preamplifiers PA0 to PA63, respectively.

Further, DRAM data path 556 includes a spare read data latch SRLH which latches and transfers the output data of spare preamplifier SPA in accordance with a clock signal, not shown, when a test mode instructing signal TE is activated, and a spare output buffer SOBF which buffers the output data of spare read data latch SRLH to generate spare read data SQ. The output state of spare read data latch SRLH may be set so as to set spare output buffer SOBF in an output high impedance state when spare column check test mode instructing signal SPCC is inactivated. Alternatively, spare output buffer SOBF may be set in an output high impedance state when spare column check test mode instructing signal SPCC is inactivated.

DRAM data path 556 further includes input buffers IBF0 to IBF63 which are provided corresponding to write data bits D0 to D63, respectively, write data latch WLH0 to WLH63, provided corresponding to input buffers IBF0 to IBF63, for latching the output data bits of corresponding input buffers IBF0 to IBF63 in accordance with a clock signal, not shown, to transfer the output data bits to corresponding write drivers WV0 to WV63, respectively, a multiplexer MX70 which selects one of the output data bits of input buffers IBF0 to IBF63 in accordance with select signals WSEL0 to WSEL63 from redundancy control circuit CRC, respectively, a multiplexer MX71 which selects one of the output data of multiplexer MX70 and the output data of spare input buffer SIBF in accordance with spare column check test mode instructing signal SPCC, and a spare write data latch SWLH which latches the output data of multiplexer MX71 in accordance with a clock signal, not shown, and transfers the latched data to spare write driver SWV.

When spare column check test mode instructing signal SPCC is inactive, multiplexer MX71 selects the output data of multiplexer MX70 and transfers the selected output data to spare write data latch SWLH. When spare column check test mode instructing signal SPCC is activated, multiplexer MX71 selects the output data of spare input buffer SIBF for transference to spare write data latch SWLH. When spare column check test mode instructing signal SPCC is deactivated, this spare input buffer SIBF may be set in an output high impedance state.

In a normal operation mode, DRAM data path 556 performs redundancy replacement (data line replacement) for repairing a fail column under the control of redundancy control circuit CRC. That is, in data read, the output data of the preamplifier corresponding to a fail read data line is replaced by the output data of spare amplifier SPA by multiplexers MX0 to MX63. In data write, the write data transferred to this fail write data line is transferred to spare write data latch SWLH by multiplexers MX70 and MX71 and transferred onto spare write data line SWDL by spare write driver SWV. In this case, although data is written to a fail column as well, no problem occurs because the fail read data line corresponding to the fail memory cell is replaced by the spare read data line.

Further, a case may be possibly considered where no redundancy replacement is performed, multiplexer MX70 does not select data and spare write driver SWV writes invalid data to a spare memory cell. Even in this case, when this row block is accessed, even if invalid data is written to the spare memory cell, no problem occurs because redundancy replacement is not performed.

In a test operation mode for spare determination performed before fail address programming, redundancy control circuit CRC sets all of select signals RSEL0 to RSEL63 in an inactive state and causes multiplexers MX0 to MX63 to select the output data of corresponding preamplifiers PA0 to PA63, respectively. In addition, in this test operation mode for repair determination, spare read data latch SRLH is activated, the output data of spare amplifier SPA is transferred and spare read data SQ is generated by spare output buffer SOBF.

Likewise, in this test operation mode for repair determination, input data SD of spare input buffer SIBF is selected by multiplexer MX71 and transferred to spare write driver SRV through spare write data latch SWLH. In the test operation mode for repair determination, therefore, it is possible to directly access the spare read data line and the spare write data line externally.

FIG. 17 is a schematic diagram showing the configuration of a part related to data write in TIC data paths 556e and 556w shown in FIG. 12. In FIG. 17, the configuration of a part for generating write data in TIC control circuit 562 is also shown. TIC control circuit 562 includes a cycle shift circuit 600 which transfers test data TD<7:0> of 8 bits in accordance with test clock signal TCLK. This cycle shift circuit 600 delays applied test data TD<7:0> by a predetermined cycle period of test clock signal TCLK and outputs test data TD<7:0>.

In addition, address signals AD<12:0> of 13 bits and spare address space addressing address signal ADsp are applied to TIC control circuit 562.

Data Df<7:0> of 8 bits synchronized with test clock signal TCLK is generated from this cycle shift circuit 600.

TIC data path 560e includes drive circuits DRE0 to DRE7 each of which copies data Df<7:0> and generates 8-bit data, and a driver SDRe which copies data Df<7> and generates spare data SD<1>. Drive circuits DRE0 to DRE7 include drivers of 8 bits for generating data of 8 bits, i.e., D<64:71>, D<72:79>, . . . and <120:127>, respectively. Therefore, each of 8-bit data D<64:71>, D<72:79>, . . . and <120:127> has the same data pattern as that of data Df<7:0>.

Likewise, TIC data path 560w includes drive circuits DRW0 to DRW7 which copy data Df<7:0> and each generate 8-bit data, and a driver SDRw which copies data Df<7> and generates spare data SD<1>. Drive circuits DRW0 to DRW7 generate data of 8 bits, i.e., D<7:0>, D<15:8>, . . . and <63:56>, respectively. Each of the 8-bit data generated by data path 560w has the same data pattern.

Here, the data pattern of test data TD<7:0> is expanded to data of 128 bits so as to satisfy the following conditions.

D<8·n+m>=TD<m>, where n is an integer from 0 to 15 and m is an integer from 0 to 7.

Each of TIC data paths 560e and 560w copies data Df<7:0>, whereby 128-bit data can be generated from the 8-bit data and transmitted to DRAM core 510 and spare write data SD<0> and SD<1> can be transferred to DRAM core 510 as well.

FIG. 18 is a schematic diagram showing the configurations of data read sections of TIC data paths 560e and 560w shown in FIG. 12. Since TIC data paths 560e and 560w have the same configuration, the configuration of TIC data path 560w is specifically shown and that of TIC data path 560e is simply shown by blocks in FIG. 18.

TIC data path 560w includes unit processing circuits UPW0 to UPW7 which are arranged corresponding to 8-bit data Q<7:0> to Q<63:56>, respectively, and a tri-state buffer 600w which is provided corresponding to spare read data SQ<0>.

Unit processing circuits UPW0 to UPW7 have the same configuration, and each includes a tri-state buffer 610 which buffers corresponding 8-bit data Q and generates internal data TQf<7:0> when activated, and a comparison circuit 612 which compares corresponding internal read data Q with expected value data CMPD<7:0>, compresses the comparison result to data of 1 bit and outputs the compressed 1-bit data.

Tri-state buffer circuit 610 is activated in accordance with corresponding select signal QSEL among select signals QSEL<15:0>generated in accordance with an address signal from TIC control circuit 562. Tri-state buffer 600w is selectively activated in accordance with a select signal SQSEL<0> from TIC control circuit 562.

TIC data path 560e includes tri-state buffer circuit 600e provided corresponding to spare data SQ<1> and unit processing circuits UPE0 to UPE7 provided corresponding to 8-bit data Q<64:71> to Q<120:127>, respectively. Unit processing circuits UPE0 to UPE7 are selectively activated in accordance with corresponding select signals QSEL<15:0>, respectively, as in the case of unit processing circuits UPW0 to UPW7.

Each of unit processing circuits UPE0 to UPE7 includes a tri-state buffer circuit which buffers corresponding 8-bit data and generates internal read data TQf<7:0> when activated, and a comparison circuit 612 which performs a multi-bit test to indicate whether expected value data CMPD<7:0> is consistent with the respective data bits.

Comparison circuit 612 compares 8-bit expected value data CMPD<7:0> with corresponding 8-bit data D<8·n+7:8·n> on a bit by bit basis and compresses the 8-bit signal obtained by bit-by-bit comparison to a 1-bit signal Qbtf<n>. 16-bit signal Qmbtf<15:0> indicating the comparison result from comparison circuit 612 are further compressed by TIC control circuit 562, and a 1-bit multi-bit result indication signal TQmbt is generated and transferred to the external tester. In the compression, it is merely determined whether the logic level of each bit of 16-bit signal Qmbtf<15:0> indicates a normal state (AND processing is performed).

FIG. 19 is a schematic diagram showing the configuration of a part for generating the select signals in TIC control circuit 562 shown in FIG. 18. In FIG. 19, TIC control circuit 562 includes a flip-flop 620 which transfers address signal AD<12:0> and the spare space addressing signal ADsp synchronously with test clock signal TCLK an generates internal signals intAD<12:0> and intADsp, a flip-flop 621 which further transfers internal address signals intAD<12:0> and intADsp from flip-flop 620 synchronously with test clock signal TCLK and generates row address signal RA<12:0> and spare row space addressing address signal RAsp, a flip-flop 622 which transfers address signal intAD<3:0> of 4 bits from flip-flop 620 synchronously with test clock signal TCLK and generates column address signal CA<3:0>, cascaded flip-flops 623 to 625 of three stages which transfer internal address signals intAD<9:6> of 4 bits and intADsp from flip-flop 620 synchronously with test clock signal TCLK, and a decoder 626 which decodes the output signal of flip-flop 625 and generates select signals QSEL<15:0> and SQSEL<1:0>.

The reason for using three flip-flops 623 to 625 at a preceding stage of decoder 626 is to delay the output signal of this decoder 626 by a time period corresponding to latency in reading of bit data. This latency indicates the time period (clock cycle) required since a read operation instructing signal instructing data read is applied from test interface circuit 512 to DRAM core 510 until test data is read from DRAM core 510 and transferred to test interface circuit 512. Here, latency is assumed 2 (two clock cycles).

Each of flip-flops 620 to 625 outputs a signal synchronously with the rise of test clock signal TCLK.

FIG. 20 is a timing chart representing the operation of DRAM macro 504 shown in FIGS. 12 to 19 when test data is read. The test data read operation of this DRAM macro will now be described with reference to FIG. 20.

Test interface circuit (TIC) 512 delays control signals externally applied by one clock cycle of test clock signal TCLK and transfers the delayed control signals to DRAM core 510. Accordingly, DRAM core 510 takes in the control signals and address signals at the rise of test clock signal TCLK two clock cycles after when the control signals and the others are applied from the tester to test interface circuit 512, and executes internal operation. In FIG. 20, clock signal CLK and test clock signal TCLK applied to DRAM core 510 are assumed the same in waveform.

At time T1, control signals representing row activation instructing signal ACT are applied to test interface circuit 512 and also row address signal RA(k) of 13 bits are applied to test interface circuit 512. Test interface circuit TIC 512 decodes the control signals applied externally and transfers the row activation instructing signal ACT to DRAM core 510 in accordance with the decoding result, synchronously with the rise of clock signal TCLK. As shown in FIG. 19, at this time, row address signal RA(k) is also transferred synchronously with the rise of test clock signal TCLK.

DRAM core 510 takes in row activation instructing signal ACT as well as row address signal RA(k) synchronously with the rise of clock signal CLK at time T3 and executes an internal row select operation.

Next, at time T2, a write operation instructing signal instructing data write as well as column address signal CA(m) and test data TD(m) is applied to test interface circuit TIC 512. Test interface circuit TIC 512 takes in the control signals, column address signals and test data synchronously with the rise of test clock signal TCLK, performs internal control signal decoding operation, and transfers write operation instructing signal WRITE, column address signal CA(m) and test data D(m) for DRAM core 510 to DRAM core 510 synchronously with the rise of clock signal TCLK at time T3.

DRAM core 510 takes in write operation instructing signal WRITE, column address signal CA(m) and data D(m) synchronously with the rise of clock signal CLK at time T4, executes column select operation and writes data D(m) of 128 bits to columns designated by column address signal CA(m).

At time T3, a command (READ) representing data read as well as column address signals CA(n) and test data TD(n) are applied to test interface circuit TIC 512. Test data TD(n) in data read is used as expected value data CLPD<7:0> to be compared by the data paths of test interface circuit TIC 512.

Test data TD(n) applied to test interface circuit TIC 512 at time T3, is not transferred to DRAM core 510 since TIC data paths do not execute write operation. In the timings shown in FIG. 20, in particular, comparison data are generated by shifting externally applied data by a predetermined cycle period in view of column latency in data write and then applied to the internal comparison circuit. In this case, therefore, when comparison data is inputted, write data written in response to the write command is already transferred internally and then transferred to DRAM core 510. As a result, no problem occurs even if write data as well as the read command is applied to test interface circuit TIC 512.

It is noted, however, if it is required to input comparison data at an earlier cycle than that of the application of the read command because of the restriction of the number of stages of delays for generating comparison data internally, a restriction that the write operation cannot be performed on this comparison data inputted, or other occurs.

A command (READ) applied to test interface circuit TIC 512 at time T3 is decoded by test interface circuit TIC 512, read operation instructing signal READ is generated, and read operation instructing signal READ and column address signal CA(n) are applied to DRAM core 510 synchronously with the rise of test clock signal TCLK at time T4. Here, the command instructs an operation mode by a combination of a plurality of control signals.

DRAM core 510 performs a column select operation in accordance with read operation instructing signal READ and column address signal CA(n) synchronously with the rising edge of clock signal TCLK at time T5, and reads test data internally.

At time T4, control signals (PRE) representing precharge operation are applied to test interface circuit TIC 512 and decoded by test interface circuit TIC 512, and row deactivation instructing signal PRE is transferred to DRAM core 510. At time T6, DRAM core 510 executes internally precharge operation.

DRAM core 510, which has column latency of 2 cycles, reads the data read internally in accordance with read operation instructing signal READ applied at time T5 in a clock cycle starting at time T6, and applies read data Q(n) to test interface circuit TIC 512 at time T7.

In test interface circuit 512, 8-bit data is generated from 128-bit data Q(n) transferred from DRAM core 510 in the clock cycle starting at time T6 in accordance with the select signals from decoder 626 shown in FIG. 19, data TQ(n) taken in at time T3 is compared with the read data by the comparison circuits and the signals indicating the comparison results are generated by time T7. In a clock cycle starting at this time T7, test interface circuit TIC 512 outputs 8-bit test data TQ(n) as well as multi-bit test result indication signal Qmbt(n).

Decoder 626 and flip-flops 620 to 625 shown in FIG. 19 constantly operate synchronously with test clock signal TCLK. Accordingly, by sequentially applying address signals intAD<9:6> and ADsp shown in FIG. 19 in respective clock cycles, 8-bit data is sequentially selected according to select signals QSEL<15:0> and SQSEL<1:0> outputted from decoder 626 and read from test interface circuit TIC 512.

The external tester compares 8-bit test data TD(n) with test read data TQ(n) bit by bit when multi-bit test result indication signal Qmbt(n) indicates the non-coincidence, and specifies the location of a fail memory cell. If multi-bit test instructing signal Qmbt(n) indicates coincidence, each bit of 8-bit test data TQ(n) is determined to be normal. As a result, the external tester is not required to specify the location of the fail memory cell for each 8-bit test data, thereby shortening test time.

FIG. 21 is a schematic diagram showing the configuration of a part related to spare read data bits in test interface circuit TIC 512. Since TIC data paths 560e and 560w have the same configuration for spare read data SQ<1> and SQ<0>, respectively, spare read data SQ in one TIC read data path 560 is representatively shown for TIC data paths 560e and 560w in FIG. 21.

In FIG. 21, a spare read data bit processing section includes tri-state buffer 600 which receives spare data bit SQ from the corresponding DRAM data path, and tri-state buffers FDR6 to FDR0 each supplied with a power supply voltage VCC as an input. Tri-state buffers 600 and FDR6 to FDR0 are activated when spare select signal SQSEL is activated and generate internal data TQf<7> to TQf<0>, respectively when activated.

Therefore, if spare data bits are read externally through test interface circuit TIC 512 in a memory test for repair determination, 7-bit data TQ<6:0> having each bit fixed to H level is outputted together with spare data bit TQ<7>. No multi-bit test is performed on the spare data bit because the spare data bit is data of one bit.

If the spare data bit is read together with the other fixed data and applied to the external tester, such a problem arises that the test cannot be performed while successively accessing a spare column address space and a normal column address space, as will be described in the following.

FIG. 22 is a schematic diagram showing the mapping of a fail bit memory in the external tester. This fail bit memory is provided in the tester, and stores pass/fail information on the memory cells of DRAM core 510 bit by bit (for each memory cell). In the fail bit memory, a fail memory cell is identified for fuse blowing for fail address programming and it is also determined whether the fail memory cell can be repaired. In this determination, it is determined whether or not there is a fail row/column and whether or not the fail row/column can be repaired based on the data stored in the fail bit memory.

In FIG. 22, in fail bit memory 650, row addressing is made by address RA<12:0> and spare row address space addressing address signal RAsp in the row direction and column addressing is made by address AD<9:6>, test data TQ<7:0>, spare address space addressing address signal ADsp and column addresses CA<3:0> in the column direction. By way of example, FIG. 22 shows that data group TUG of 136 bits is designated in fail bit memory 650 by column address CA<3:0> in the column direction.

If the spare column address space is designated continuously with the normal column address space as shown in FIG. 22, normal memory cell data groups NQG each formed of 8 bits and spare memory cell data groups SQG each formed of 8 bits are continuously arranged as shown in FIG. 23. The data bits may be mapped according to data terminals and these bits of 8-bit data may be stored in a distributed manner.

In the region of normal memory cell data group NQG, each of the 8-bit memory cells stores data indicating pass/fail. In spare memory cell data group SQG, memory cells corresponding to the 7-bit H-fixed data region each store fail bits F, as shown in FIG. 24. In a spare memory cell region which stores spare data bit SQ, a pass/fail bit P/F is stored in accordance with the coincidence/non-coincidence with the expected value data.

If a test is performed using various test data patterns, fail bits F are stored in the spare column address region of these 7-bit memory cells because expected value data CMPD has various patterns different from that of H-fixed data. Upon determination on whether or not a fail cell can be repaired, this repair determination is made in accordance with the distribution of fail bits. Therefore, if such fail bits are stored in the spare column address space, the entire of the spare column address region is always determined to be fail and the repair determination cannot be accurately made. If pass/fail bit information is disposed in a distributed manner in this fail/bit memory in accordance with the test terminals, in particular, fail bits F are distributed in accordance with the respective terminals and mixed with data for the normal memory cells, making it even more difficult to specify a fail memory cell.

To prevent fail bit F from being stored in the spare column address region, it is necessary to take the following measures in the tester. Specifically, in the tester, a comparison circuit which determines whether the data transferred from the test interface circuit is consistent with the expected value is isolated from the test terminals when the spare data bits are transferred, so that the fail bit information can not be stored in the fail bit memory. The changeover of the connection of the test terminals to the comparison circuits cannot be executed at real time while a test is performed with various test patterns being generated. In this case, one possible solution may be considered to provide the following configuration in the tester.

FIG. 25 shows one example of the possible configuration of this external tester. In FIG. 25, the external tester includes a register 660 which stores expected value data TD, a comparison circuit 662 which compares the expected value data from register 660 with test read data TQ<7:0> of 8 bits applied from test interface circuit 512, and a selector 664 which selects one of the output signal of lower 7 bits of comparison circuit 662 and power supply voltage VCC level in accordance with spare address space addressing address signal ADsp. The 8-bit data selected by selector 664 is written to fail bit memory 650.

In case of the arrangement shown in FIG. 25, if a spare address is designated and data is read from the spare address, selector 664 sets data TQ<6:0> of lower 7 bits at power supply voltage VCC level which indicates a pass state irrespectively of the logic level of the output signal of comparison circuit 662. Then the comparison result of data TQ<7> corresponding to the spare data bit as well as the output bits of this selector 664 are written to fail bit memory 650. In this case, therefore, data is written to fail bit memory 650 in a unit of 8 bits, the data is set in a pass/fail state in accordance with the comparison result for the spare data and the other data are all set in a pass state, making it possible to detect the fail bit of the spare memory cell. Further, unnecessary fail bits are not stored in a distributed manner in fail bit memory 650, it is possible to accurately make repair determination in accordance with the distribution of fail bits stored in fail bit memory 650.

In case of the arrangement shown in FIG. 25, however, the connection path of selector 664 is changed in accordance with spare space addressing address signal ADsp to change over the output signals of comparison circuit 662. If the transmission path of the output signals of comparison circuit 662 is changed over using address signal ADsp for spare space addressing, it takes time to transmit the output signals of comparison circuit 662 to fail memory 650, making it impossible to write the result of test data of test interface circuit 512 which operates synchronously with a high speed clock at real time.

Further, in this case, the address signal ADsp for spare space addressing is generated in the tester. Therefore, it is necessary to change the state of the address signal ADsp for spare space addressing in accordance with the timing of the spare memory cell data transferred from test interface circuit 512 and to consider a timing margin between these signals. Thus, high speed operation cannot be ensured and data indicating the pass/fail state of the spare memory cell cannot be stored at real time.

Moreover, to arrange the selector used only in a memory test for repair determination in the tester, it is necessary to modify the tester, resulting in troublesome labor for such arrangement.

Normally, therefore, in a repair determination test for determining pass/fail of normal memory cells and spare memory cells performed before fuse blowing, a normal column space and a spare column space are separately tested. By testing the address spaces separately, it is possible to dispense with selector 664 shown in FIG. 25. The normal column space is tested first. The connection of the comparison circuit with the test terminals is then changed over so as not to store fail bits for fixed data in fail bit memory 650 and then the spare column space is tested.

In the test stated above, it is necessary that after the normal column address space is tested, DRAM core 510 is temporarily set in an initial state and test conditions for the spare column address space are set. With the configuration in which memory cell rows are shared by normal memory cells and spare memory cells, it takes disadvantageously long time to perform the test. A total of two times of row select operations are performed to the normal column address space and to the spare column address space.

Further, in the test of the memory cells of DRAM core 510 as stated above, if a data pattern for a memory cell data leakage test is used, data is written to all the normal and spare memory cells once, and the memory cells are kept in a pause state (DRAM core precharged state) for, for example, 64 ms (milliseconds). Then, test is made to examine whether the data stored in these memory cells are lost by leakage current. According to the test pattern for such a data leakage test, even if the spare memory cell space is small such as a space having 16 columns, it is necessary to write the data leakage test pattern to the spare memory cells in the space and to wait for the same time as that for the normal address space. In the memory test for DRAM repair determination, various data patterns, such as the data leakage test pattern, an inter-bit line interference test pattern, a pattern of testing inter-capacitor leakage between the memory cells are used. Therefore, if the normal column address space and the spare column address space are separately tested, test time is disadvantageously lengthened because of this pause time and product cost is disadvantageously increased.

SUMMARY OF THE INVENTION

It is an object of the present invention to provide a semiconductor integrated circuit device capable of continuously testing a normal column space and a spare column space of a DRAM core.

It is another object of the present invention to provide a semiconductor integrated circuit device which includes a test interface circuit capable of continuously testing a spare memory cell and a normal memory cell even when the number of effective pins of test data input/output pins differs between the spare column space and the normal column space.

A semiconductor integrated circuit device according to the present invention includes: test data output nodes having a width of a plurality of bits; an internal data bus greater in bit width than the test data output nodes, for transferring internal data; and test circuitry for comparing a predetermined number of bits of the internal data on the internal data bus with bits of test expected value data equal in bit width to the test data output nodes in units of bits, and outputting data indicating the respective comparison results to the test data output nodes in parallel.

Bit comparison between the test data and the expected data is performed in the test circuitry, and the external tester is not required to make the comparison. Thus, the comparison results can be transferred to the external tester to be stored in the fail memory. Therefore, the changing over between the normal address space and the spare address space is not required, and the test can be performed at high speed to shorten the test time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows an example of the configuration of a comparison circuit shown in FIG. 6;

FIG. 9 shows a list of control signals for a DRAM core shown in FIG. 8;

FIG. 10 shows, in a list form, transfer signals for a test interface circuit shown in FIG. 8;

FIG. 11 shows the correspondence of the control signals shown in FIGS. 9 and 10 in the form of a truth table;

DESCRIPTION OF THE PREFERRED EMBODIMENTS

[First Embodiment]

Figure 1:
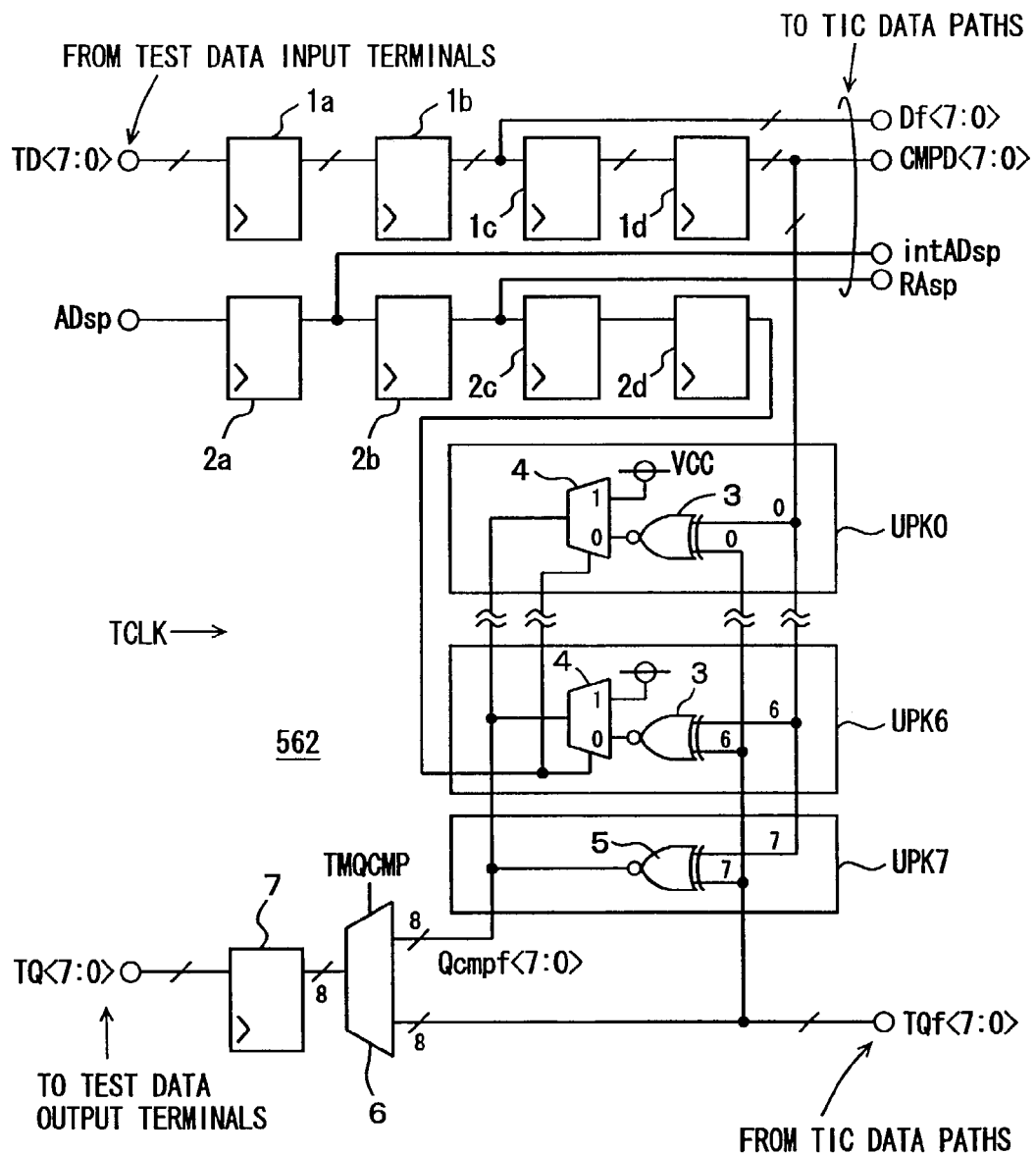
FIG. 1 is a schematic diagram showing the configuration of a main portion of a TIC control circuit according to the first embodiment of the present invention.

FIG. 1 is a schematic diagram showing the configuration of the main portion of TIC control circuit 562 according to the first embodiment of the present invention. In FIG. 1, TIC control circuit 562 includes: four stages of flip-flops 1a to 1d which transfer test data TD<7:0> of 8 bits applied from a test data input terminals (nodes) synchronously with test clock signal TCLK; cascaded flip-flops 2a to 2d of four stages which transfer spare space addressing address signal ADsp synchronously with test clock signal TCLK; unit processing circuits UPK0 to UPK7 which receive the respective bits of test read data TQf<7:0> of 8 bits from a TIC data path, not shown; a select circuit 6 which selects one of data Qcmpf<7:0> of 8 bits and test read data TQf<7:0> of 8 bits from unit processing circuits UPK0 to UPK7 in accordance with a test mode instructing signal TMQCMP; and a flip-flop 7 which transfers output signal of 8 bits from select circuit 6 synchronously with test clock signal TCLK and outputs test read data TQ<7:0> through a test data output node.

Test mode instructing signal TMQCMP is set by a test mode setting circuit, not shown, arranged in a test interface circuit. Spare address space addressing address signal ADsp designates a spare address space constituted of spare memory cells when being at H level and designates a normal address space constituted of normal memory cells when being at L level.

Figure 17:
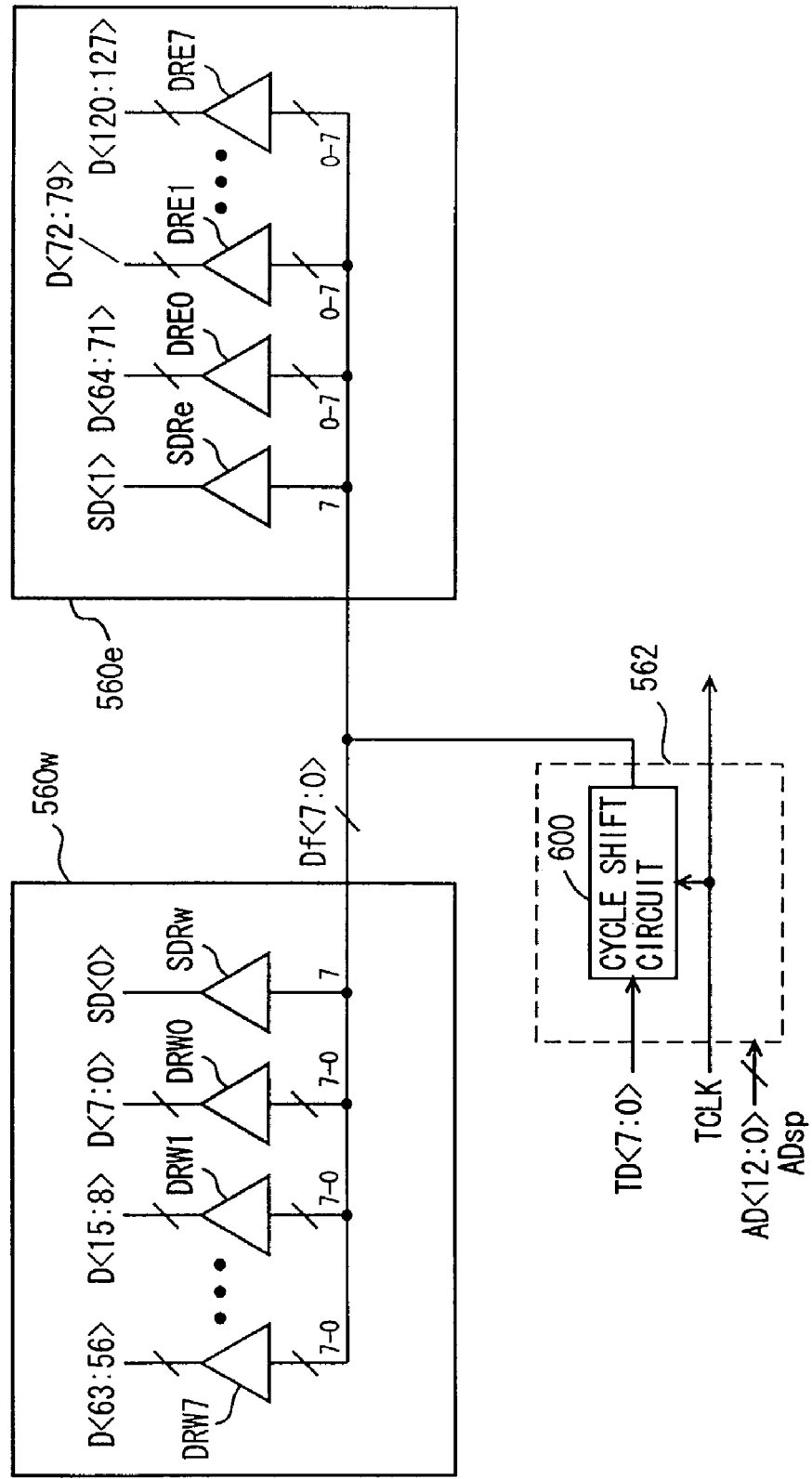
FIG. 17 is a schematic diagram showing the configuration of the data write sections of the TIC data paths shown in FIG. 12.

Test data Df<7:0> of 8 bits is outputted from flip-flop 1b and applied to TIC data paths 560e and 560w shown in FIG. 17. Test expected value data CMPD<7:0> is outputted from flip-flop 1d and applied to unit processing circuits UPK0 to UPK7.

Flip-flops 1a to 1d and 2a to 2d output signals synchronously with the rise of test clock signal TCLK. Therefore, test data TD<7:0> is delayed by 4 clock cycles by flip-flops 1a to 1d. Likewise, spare space addressing address signal ADsp is delayed by 4 clock cycles by flip-flops 2a to 2d.

Here, flip-flops 1a to 1d and 2a to 2d take in and latch the signals applied to the inputs thereof in response to the fall of test clock signal TCLK and output the latched signals in response to the rise of test clock signal TCLK. Test data TD<7:0> and spare space addressing address signal ADsp are outputted in a clock cycle after the passage of 3 clock cycles since application to the initial stages of flip-flops, and is already set in a definite state at the rise of test clock signal TCLK in the fourth clock cycle.

Figure 19:
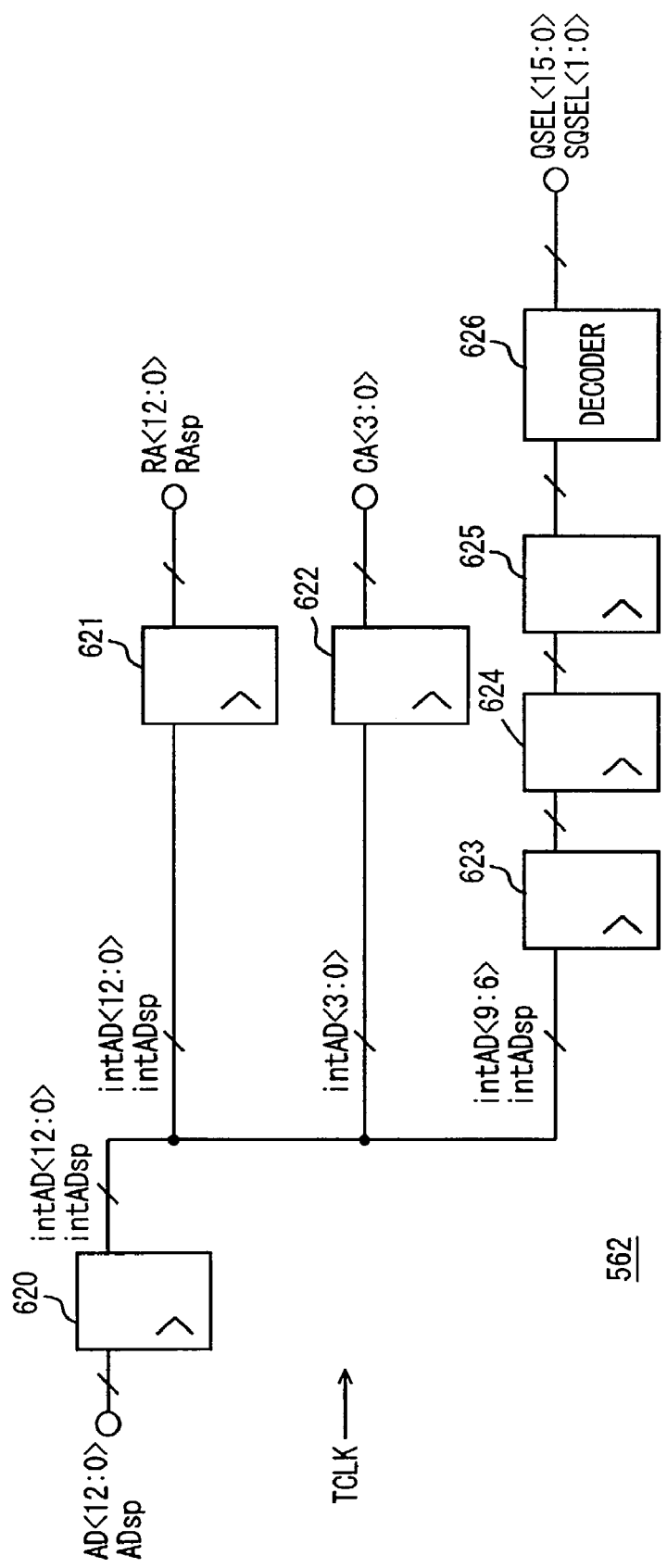
FIG. 19 is a schematic diagram showing the configuration of the address signal and select signal generation section of the TIC control circuit shown in FIG. 12.

Internal signal intADsp shown in FIG. 19 is generated from flip-flop 2a and row spare address space addressing address signal RAsp is outputted from flip-flop 2b. This row spare address space addressing address signal RAsp is applied to the DRAM core and responsively, a spare row is selected in the DRAM core. How to select a spare row is appropriately decided in accordance with the arrangement of spare rows. For example, if spare rows are arranged in respective row blocks, a spare row is designated in accordance with a row block address (if one spare row is arranged in one row block).

Unit processing circuits UPK6 to UPK0 have the same configuration and process output data bits TQf<6:0>, respectively. Each of unit processing circuits UPK0 to UPK6 includes an EXNOR circuit 3 which receives corresponding data bit TQf<i> and a corresponding bit CMPD<i> of test expected value data CMPD<6:0>, and a select circuit 4 which selects one of power supply voltage VCC and the output signal of EXNOR circuit 3 in accordance with the output signal of flip-flop 2d and generates bit Qcmpf<i>.

Figure 25:
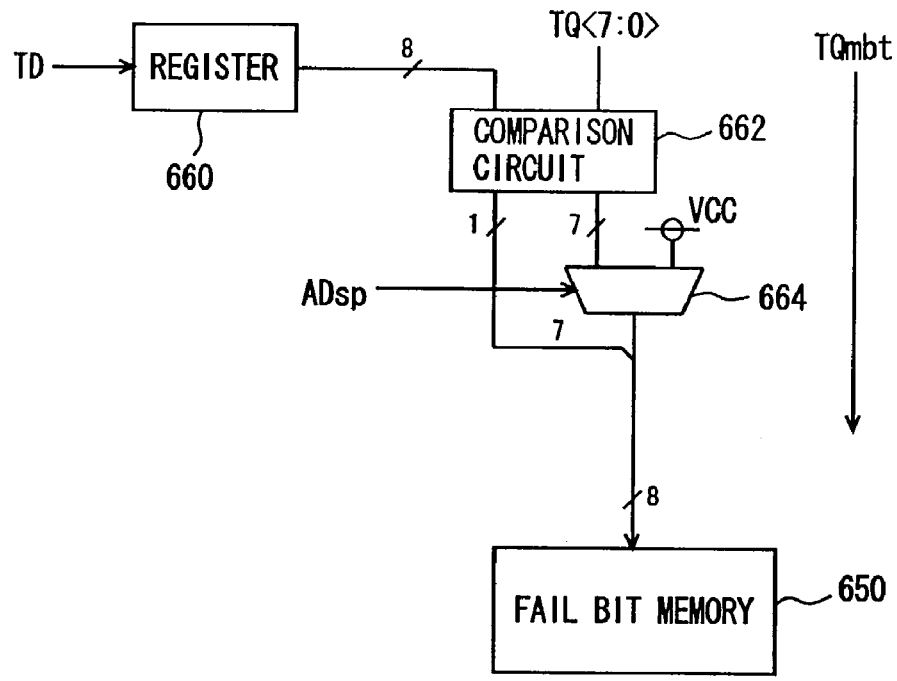
FIG. 25 shows an example of a possible configuration of the tester.
Figure 26:
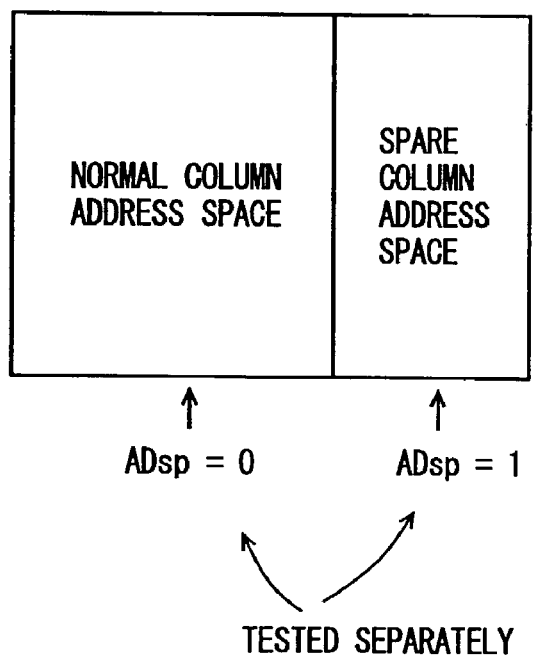
FIG. 26 is a schematic diagram showing the manner of a conventional memory test.

EXNOR circuit 3 functions as a comparison circuit, and outputs an H-level signal when the logic level of corresponding data bit TQF<i> is coincident with that of bit CMPD<i>. EXNOR circuit 3, therefore, implements the function of a comparison circuit (comparison circuit 662 shown in FIG. 25) provided in the conventional tester.

Unit processing circuit UPK7 includes an EXNOR circuit 5 which receives test read data bit TQf<7> and test expected value data bit CMPD<7>. When a spare memory cell is selected, unit processing circuit UPK7 outputs a signal indicating pass/fail of the spare memory cell in accordance with the comparison with test expected value bit CMPD<7>.

Figure 18:
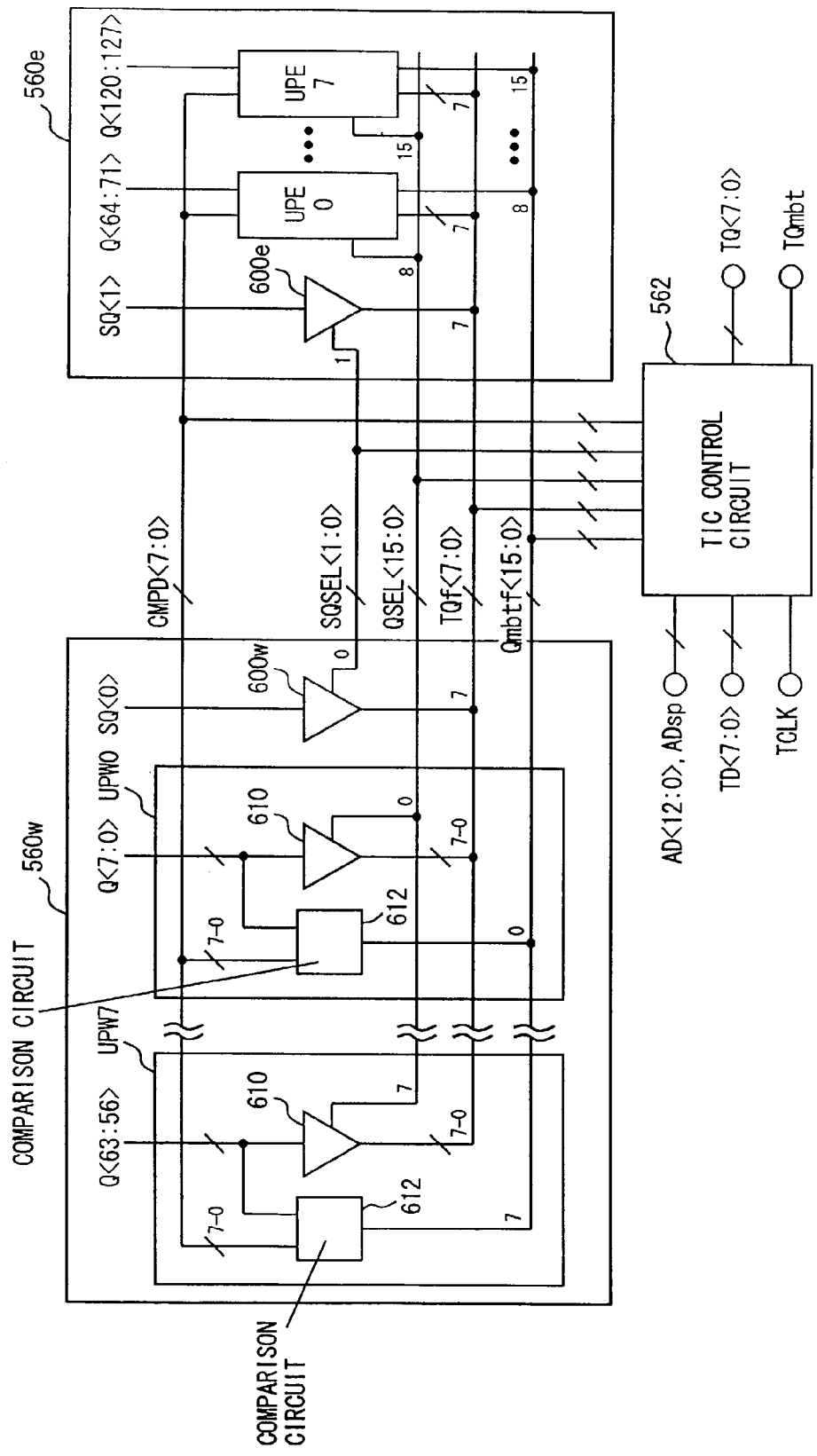
FIG. 18 is a schematic diagram showing the configuration of the data read related parts of the TIC data paths shown in FIG. 12.

TIC data paths have the same configuration as that shown in FIGS. 17 and 18, for the configuration of TIC control circuit 562 shown in FIG. 1. In a test after fuse programming, a functional test such as a multi-bit test is performed.

Figure 2:
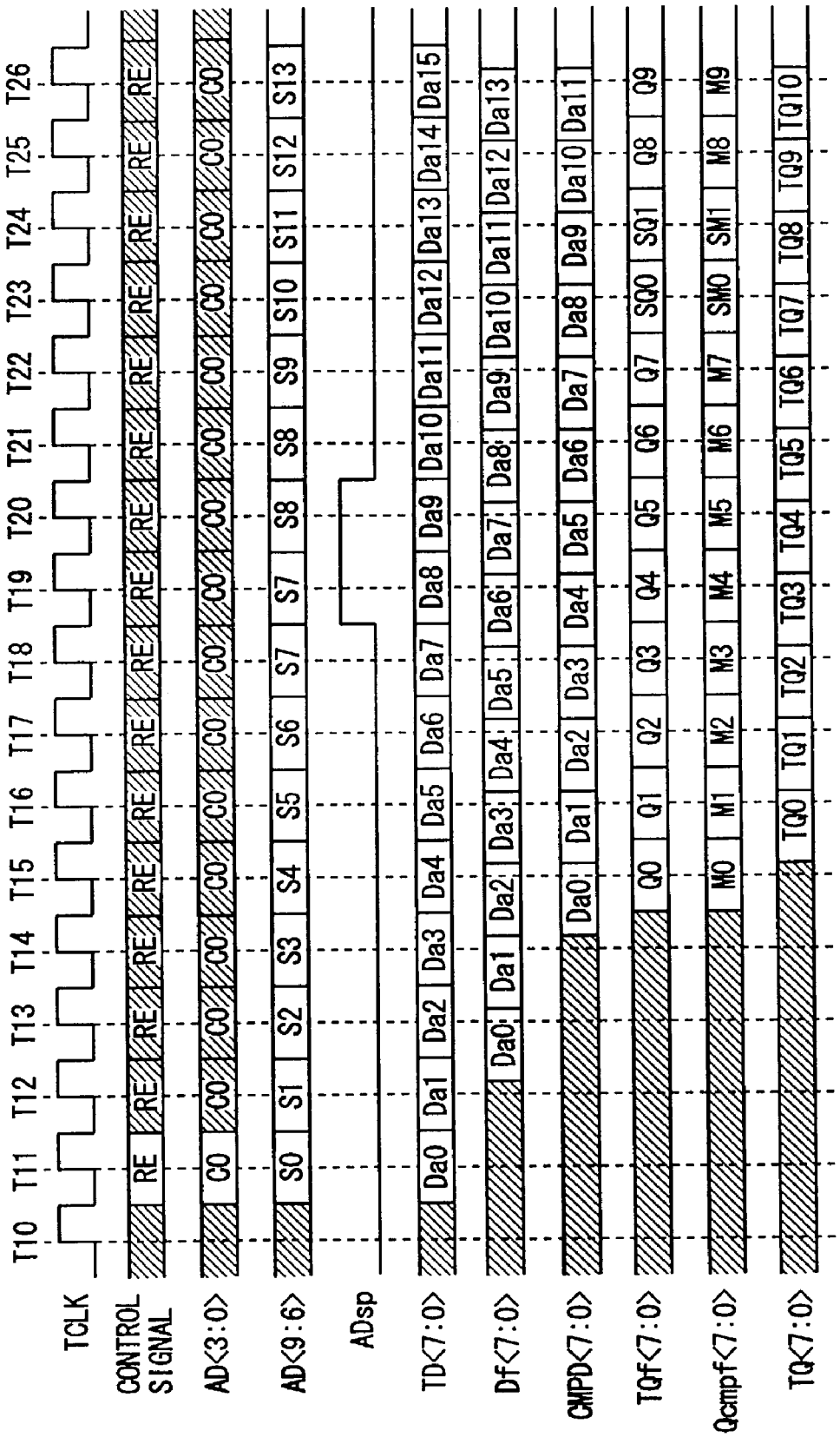
FIG. 2 is a timing chart representing the operation of the TIC control circuit shown in FIG. 1.

FIG. 2 is a timing chart representing an operation of TIC control circuit 562 shown in FIG. 1 in a data read mode. The operation of TIC control circuit 562 shown in FIG. 1 will be described now with reference to FIG. 2.

Figure 20:
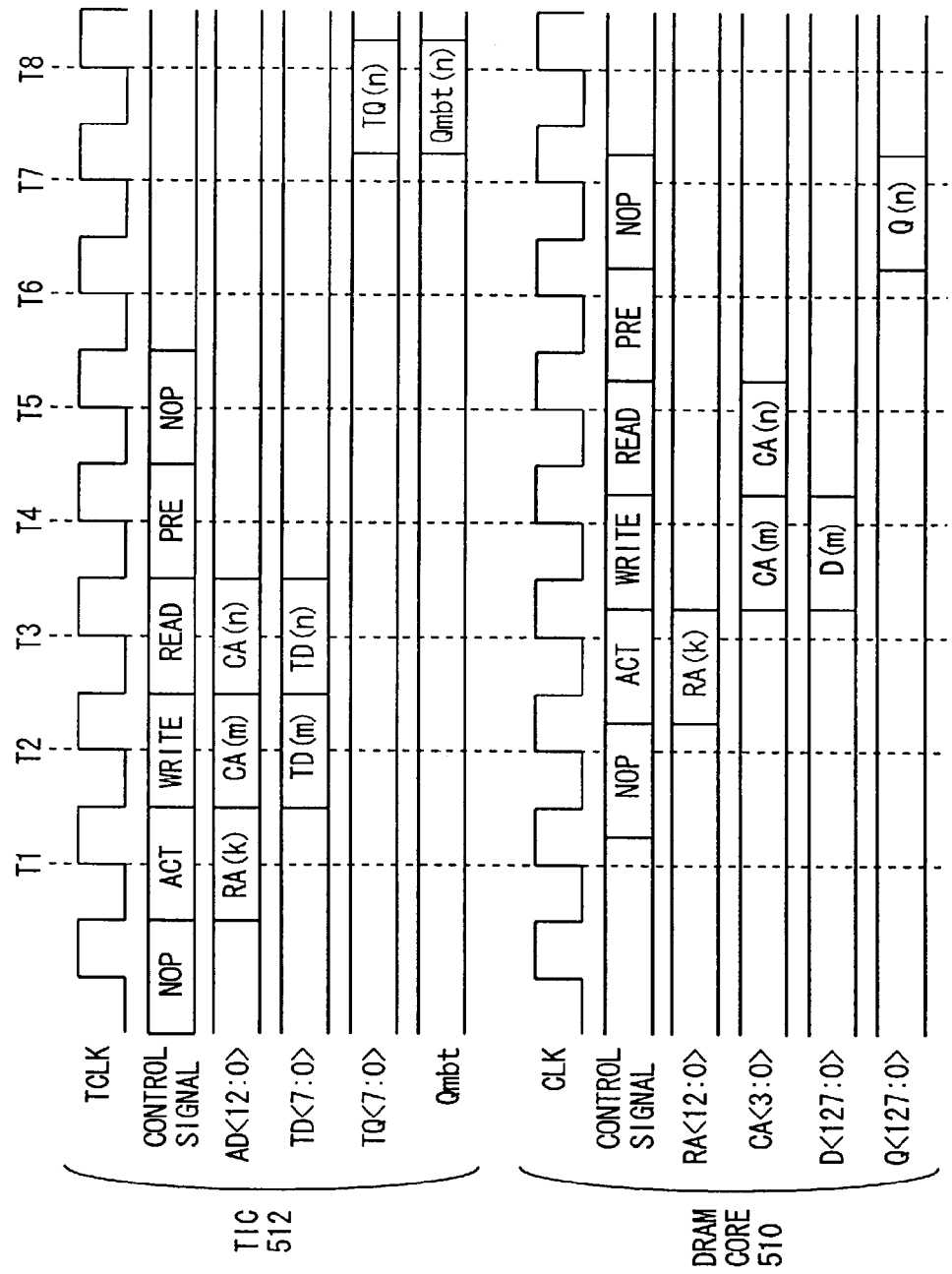
FIG. 20 is a timing chart representing an operation of the DRAM macro shown in FIG. 12.

At a rising edge of the test clock signal at time T11, a control signal RE (READ) instructing data read is applied together with address signals C0 and S0. Control signal RE applied to TIC control circuit 562 is transferred to DRAM core 510 after elapse of 2 clock cycles as shown in the timing chart of FIG. 20. It is assumed here that the column latency of DRAM core 510 is 2. In this case, after elapse of 4 clock cycles since control signal RE instructing data read is applied to test control circuit 562, read data from DRAM core 510 is transmitted to test interface circuit TIC.

Flip-flops 1a to 1d and 2a to 2d is used to provide this 4-clock-cycle delay. At time T11, data Da is applied, thereafter, data Da0, Da1 . . . are successively applied as expected value data until all the data of a total of 130 bits (136 bits if fixed value data is included) of 128 bits and spare bits selected by column address AD<3:0> are read out in an 8-bit data basis.

Data Df<7:0> is outputted from flip-flop 1b with a delay of 2 clock cycles. As already described previously, flip-flops 1a to 1d and 2a to 2d take in the received signals synchronously with the fall of test clock signal TCLK and output such taken in signals synchronously with the rising edge of test clock signal TCLK.

The read data from this DRAM macro is transferred to test interface circuit 512 in a clock cycle starting at time T14 after elapse of 3 clock cycles since the read operation instructing signal is applied to TIC control circuit 562. The data read from the DRAM macro is converted into data of 8 bits on the data path of this test interface circuit before a clock cycle starting at time T15.

At time T15, data M0 indicating the result of comparison of expected value data Da with data Q0 read from the data path, is outputted. One of data Q0 and M0 is selected by select circuit 6, taken in by flip-flop 7 and sequentially outputted from time T15 synchronously with the rising edge of test clock signal TCLK. In FIG. 2, the output data in the case when test data TQf is selected by select circuit 6, is shown by way of example.

Figure 8:
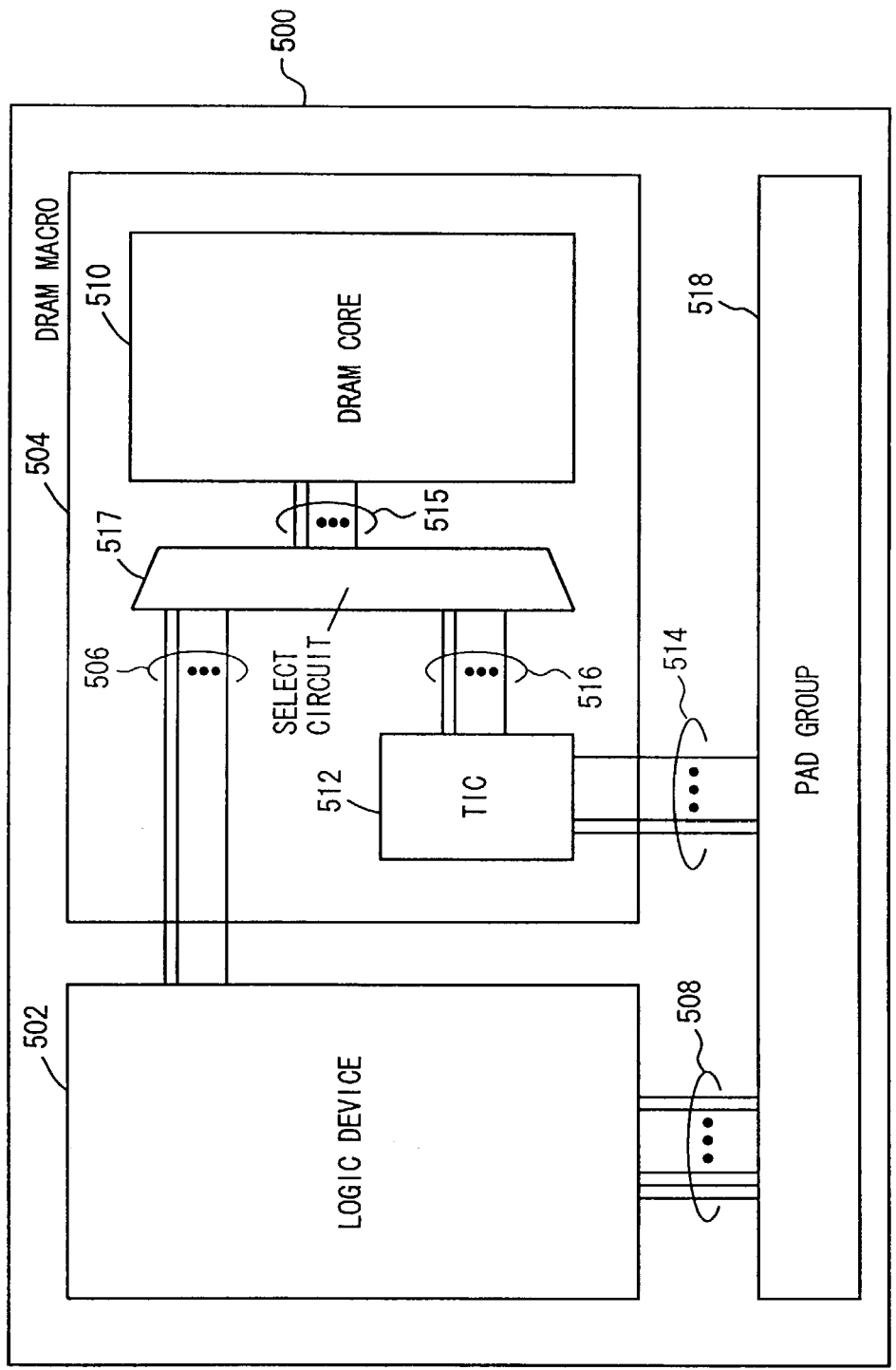
FIG. 8 is a schematic diagram showing the configuration of a conventional DRAM embedded system LSI.
Figure 12:
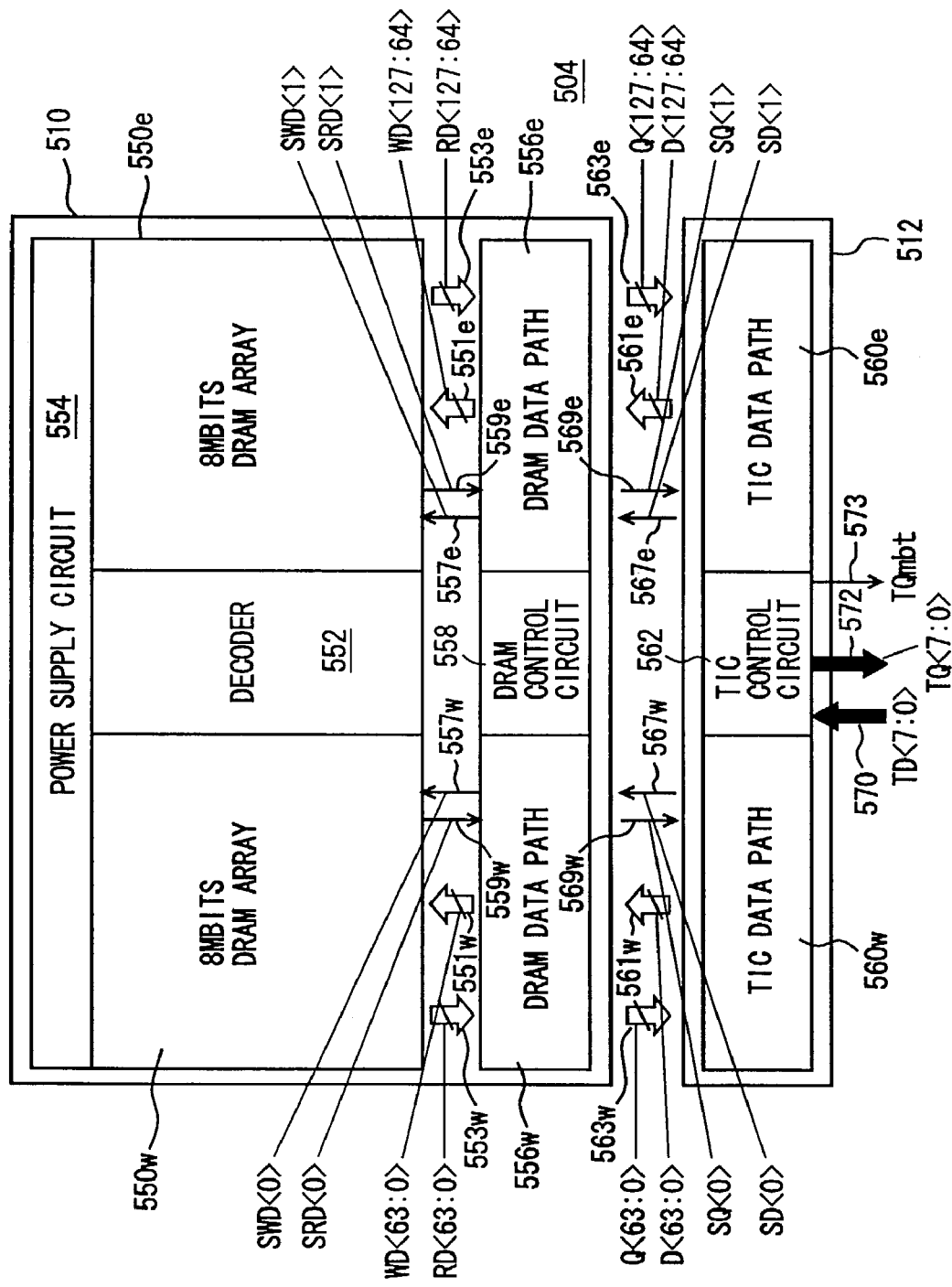
FIG. 12 is a schematic diagram showing the configuration of a conventional DRAM macro.
Figure 13:
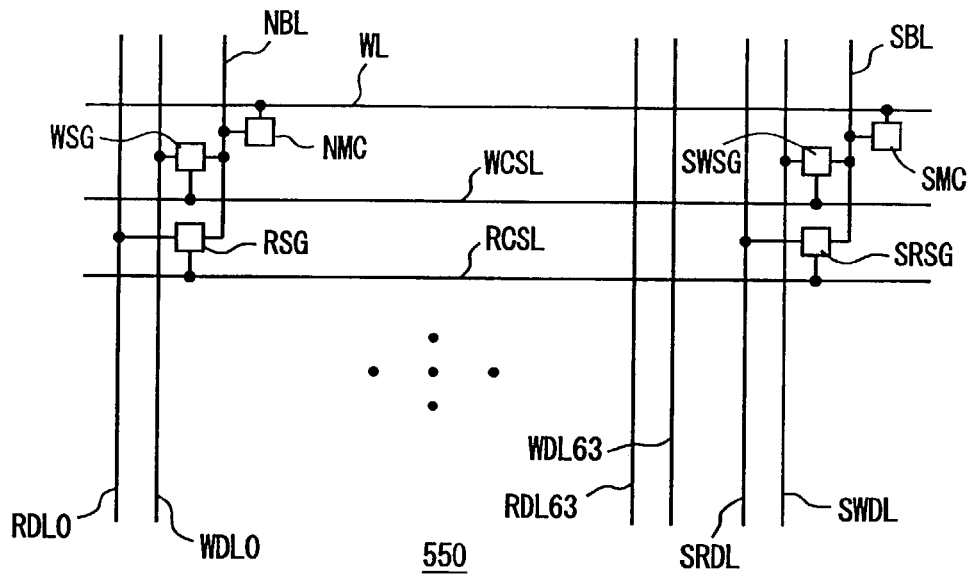
FIG. 13 is a schematic diagram showing the arrangement of the data lines of a DRAM array shown in FIG. 12.
Figure 14:
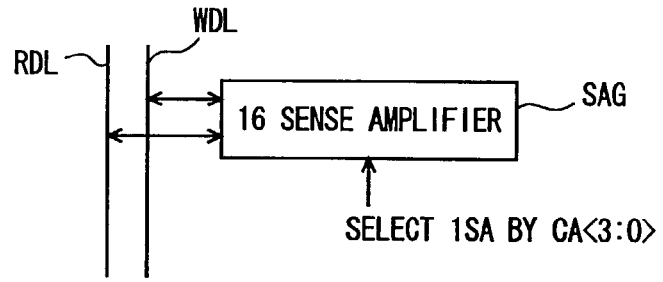
FIG. 14 is a schematic diagram showing the correspondence between a sense amplifier and one data line in the arrangement of the data lines shown in FIG. 13.
Figure 15:
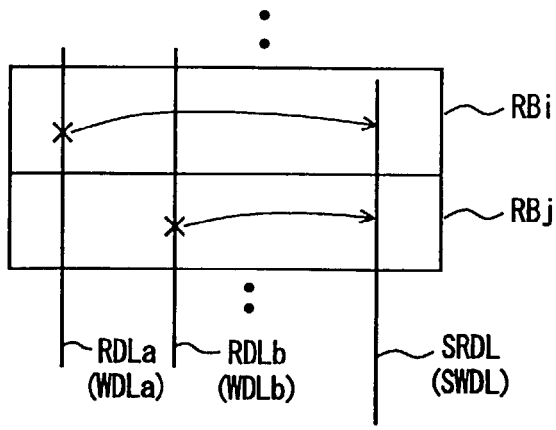
FIG. 15 is a schematic diagram showing the replacement of the fail column of the DRAM array shown in FIG. 12.
Figure 16:
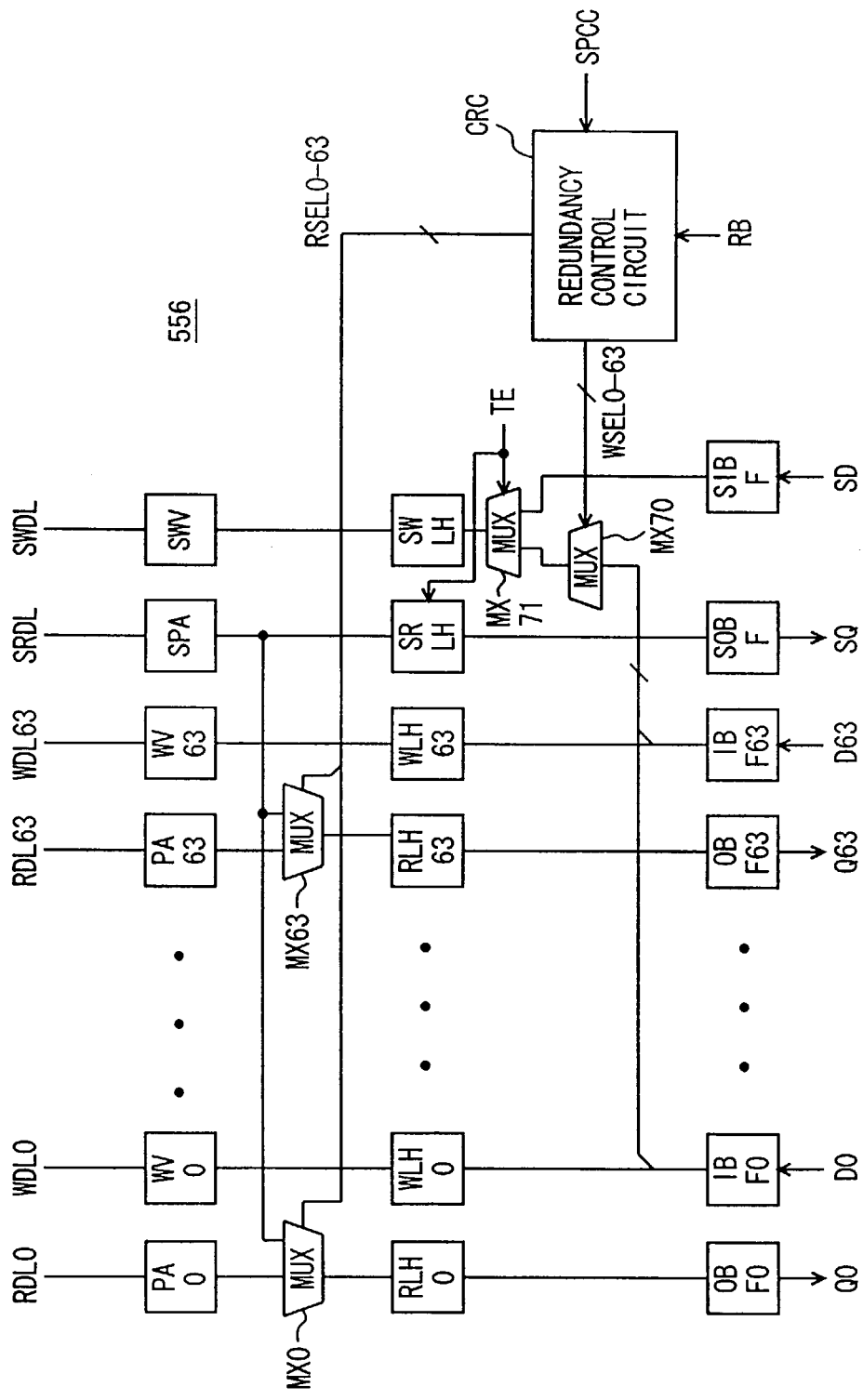
FIG. 16 is a schematic diagram showing the configuration of a DRAM data path shown in FIG. 8.

At time T11, address signal AD<9:6> are sequentially updated to addresses S0 to S7 in each clock cycle. As a result, on the data path, buffer circuits 610 are sequentially activated in accordance with select signals QSEL<15:0> shown in FIG. 18 and 8-bit data is sequentially selected and outputted. At this time, a multi-bit test result indication signal is simultaneously outputted from comparison circuit 612 and compressed into the signal TQmbt of 1 bit in TIC control circuit. In this embodiment, however, since the signals indicating whether respective bits of the memory cells are pass/fail are generated by and outputted from unit processing circuits UPK0 to UPK7, this multi-bit test result indication signal is not used.

In a clock cycle starting at time T19, spare space addressing address signal ADsp is raised to H level. When spare space addressing address signal ADsp is raised to H level, a spare column is selected. The address signal ADsp at H level applied in the clock cycle starting at time T19 is delayed by 4 clock cycles. Therefore, in the clock cycle starting at time T23, the address signal ADsp becomes H level for a 2-clock cycle period synchronously with the rising edge of clock signal TCLK. At this time, spare memory cell data SQ<0> is applied as data bit TQf<7> and is compared with expected value data CMPD<7> by EXNOR circuit 5.

Unit processing circuits UPK0 to UPK6 shown in FIG. 1 select power supply voltage VCC since the signal from the flip-flop 2d becomes H level. The logic level of power supply voltage VCC corresponds to H level and indicates a coincidence state.

Therefore, in a clock cycle starting at time T22, 8-bit data SQ0 including the spare memory cell data, i.e., data of 1 bit indicating a coincidence/non-coincidence state and data of remaining 7 bits each indicating a coincidence state for the spare memory cell data are selected as data Qcmpf<7:0> and data SM0 is generated.

In the next clock cycle, the address signal ADsp is set at H level again and address AD<9:6> is updated by one. As a result, select operations for another data read from DRAM array data path are sequentially executed.

When the address signal ADsp is at L level, all of unit processing circuits UPK0 to UPK6 select the output signals of the respective EXNOR circuits 3, as shown in FIG. 1. Therefore, for the memory cell data in this normal column space, data Qcmpf<7:0> become data indicating whether memory cells are pass/fail bits for the respective bits.

By simply updating the address signal ADsp in correspondence with the spare memory cells, the data indicating the pass/fail determination results for the actual memory cells can be accurately transferred synchronously with the clock signal. Therefore, if data TQ0, . . . are sequentially transferred as output data TQ<7:0>, even if the data TQ8 and TQ9 are the data for the spare memory cells, the external tester is not required to make a comparison operation on these data TQ8 and TQ9. It is thus possible to successively write these transferred data bits to the fail bit memory.

Consequently, it is unnecessary to change over the connection path of the comparison circuit or the connection between the comparison circuit and the test pin terminals in the tester depending on the address, but it suffices to sequentially write data TQ0, . . . to the fail bit memory. Thus, it is possible to perform a test while continuously accessing the normal column space and the spare column space.

In a memory test for repair determination performed before fuse blow for fail address programming, data indicating pass/fail is generated for each bit of the memory cell data. It is, therefore, unnecessary to use a multi-bit test result. This multi-bit test result is used in, for example, a mode for determining whether a memory cell is accurately repaired after fuse programming.

According to the configuration shown in FIG. 1, the four stages of flip-flops are arranged to provide a delay of 4 clock cycles. However, the 4 clock cycle delay is only set according to the column latency of the DRAM macro. The number of stages of the delay circuits has only to be set appropriately in view of time required for the data read from the DRAM macro to reach the TIC data path.

Further, in the timing chart shown in FIG. 2, spare memory cells are successively selected. However, the spare memory cells may be selected according to a sequence in which spare select signal SQSEL<0> is activated first, select signals QSEL<0> to QSEL<7> are then sequentially selected, and then select signal SQSEL<1> is selected, and finally select signal QSEL<8> to QSEL<15> are sequentially selected in the data path configuration shown in FIG. 18.

The order of selecting the memory cells has only to be appropriately set depending on the address mapping of the fail bit memory.

Further, the timing at which expected value data CMPD<7:0> turn into a definite state and timing at which data TQf<7:0> from the TIC data path turn into a definite state may be set different from each other. It only suffices that the output signals of unit processing circuits are in a definite state when flip-flop 7 takes in the output signals of unit processing circuits UPK0 to UPK7 in accordance with test clock signal TCLK.

Flip-flop 7 takes in the applied signals when test clock signal TCLK is at L level and outputs the fetched signals/data when test clock signal TCKL becomes H level.

In addition, an OR circuit which receives the output signals of flip-flop 2*d* and of corresponding EXNOR circuit 3 may be employed as select circuit 4.

As stated so far, according to the first embodiment of the present invention, it-is determined whether the 8-bit test data are coincident/non-coincident with the respective bits of the expected value data in the test interface circuit and the determination results are outputted to the external tester through the output nodes. Therefore, the tester is not required to compare the respective bits of the test data with the expected value data bits and to differentiate the normal column space from the spare column space. The external tester can continuously test the normal column space and the spare column space by writing data transferred from this test interface circuit to the fail bit memory without using the comparison circuit.

Moreover, in the space column space, the signals indicating coincidence states are selected for bits other than the spare memory cells and the signals and the data indicating the coincidence/non-coincidence of the spare memory cell data are formed into data of 8 bits and transferred. It is, therefore, possible to accurately make pass/fail determination for the spare memory cell data.

Figure 22:
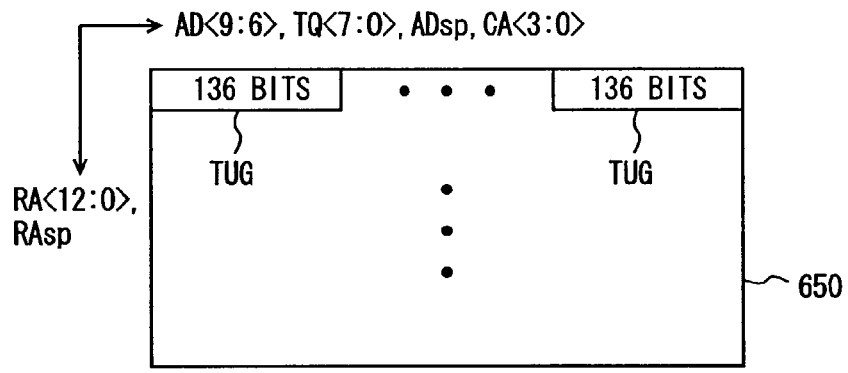
FIG. 22 is a schematic diagram showing one example of the mapping of a fail bit memory in a tester.
Figure 23:
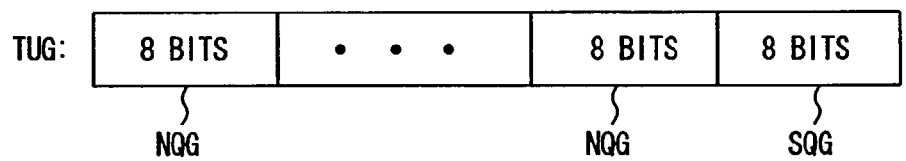
FIG. 23 is a schematic diagram showing the configuration of unit data bit group TUG shown in FIG. 22.
Figure 24:
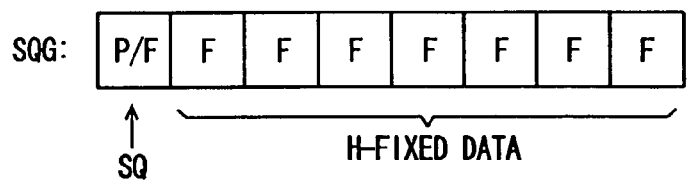
FIG. 24 is a schematic diagram showing the configuration of the spare memory cells of the 8-bit data group shown in FIG. 23.

It is noted that the mapping of the fail bit memory is not limited to that shown in FIG. 22. It is also possible to store bits indicating pass/fail of the memory cells in accordance with column address CA<3:0> for each data terminal.

[Second Embodiment]

Figure 3:
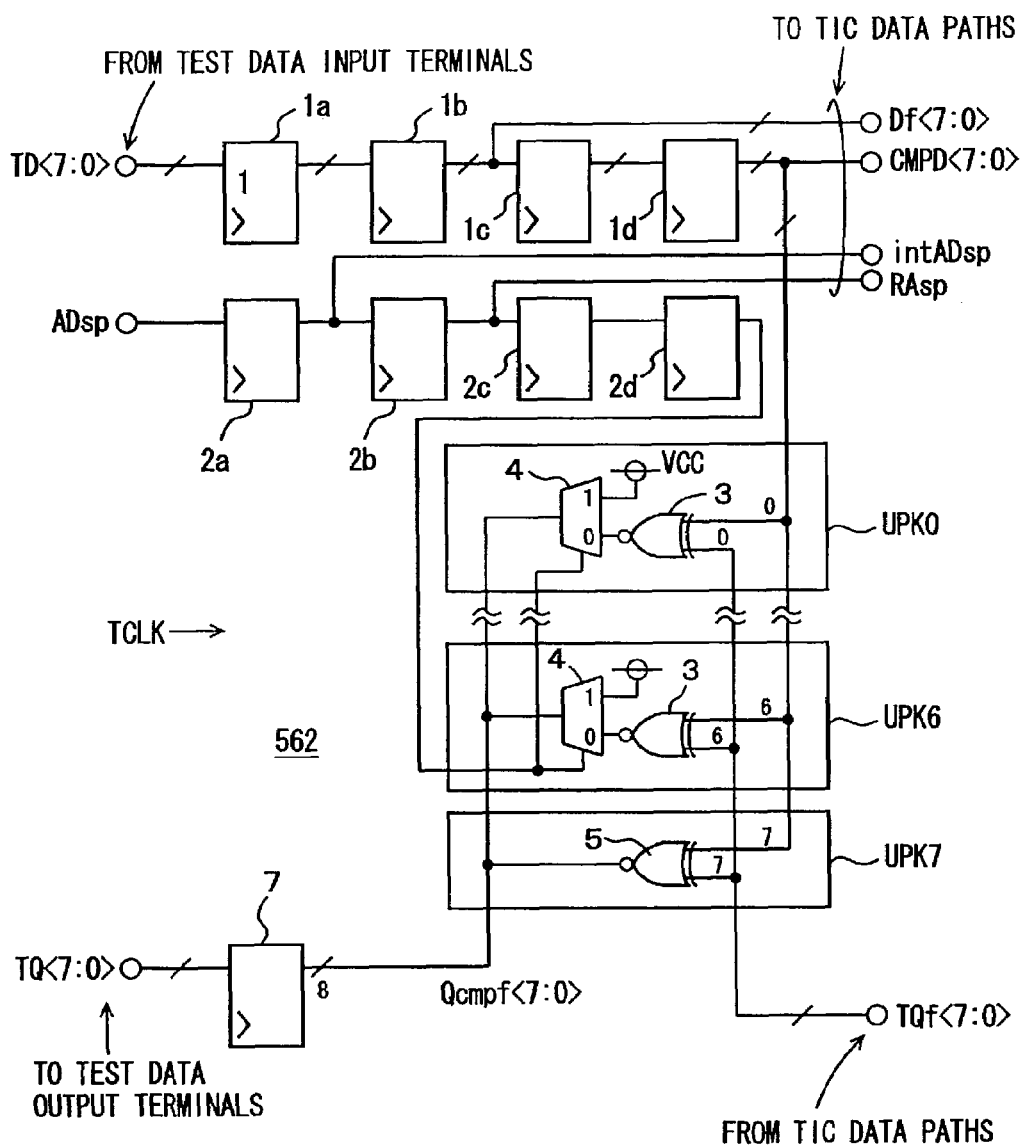
FIG. 3 is a schematic diagram showing the configuration of a main portion of a TIC control circuit according to the second embodiment of the present invention.
Figure 4:
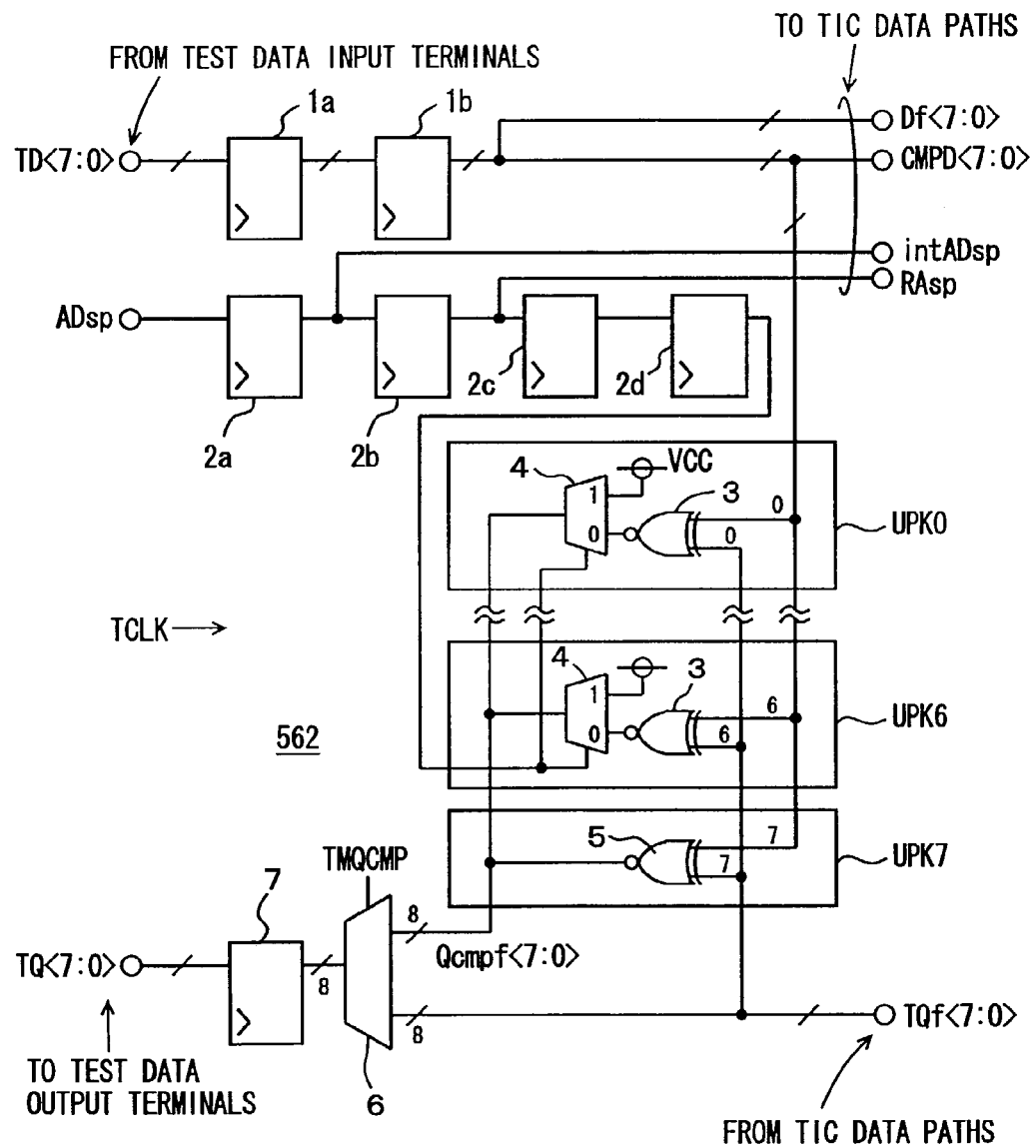
FIG. 4 is a schematic diagram showing the configuration of a main portion of a TIC control circuit according to the third embodiment of the present invention.

FIG. 3 is a schematic diagram showing the configuration of a main portion of TIC control circuit 562 according to the second embodiment of the present invention. In TIC control circuit 562 shown in FIG. 3, output signal Qcmpf<7:0> of 8 bits of unit processing circuits UPK0 to UPK7 is applied to flip-flop 7. Select circuit 6 shown in FIG. 4 is not used. Since the remaining configuration shown in FIG. 3 is the same as that shown in FIG. 1, corresponding parts are denoted by the same reference symbols and will not be described in detail.

By omitting select circuit 6, it is possible to reduce the layout area of TIC control circuit 562.

With the configuration shown in FIG. 3, data indicating pass/fail of each bit of TQf<7:0> of 8 bits can be always transferred as data TQ<7:0> to the tester through flip-flop 7. After a laser trimming step for repairing a fail cell, data on a spare data line is not directly outputted from the DRAM core. The spare data line replaces a data line arranged corresponding to a fail memory cell internally, and the data of a spare memory cell is transferred. Therefore, spare column space addressing address signal ADsp is always set at L level and select circuits 4 of unit processing circuits UPK0 to UPK6 select the output signals of corresponding EXNOR circuits 3.

In this case, therefore, by outputting H-level data as expected value data CMPD<7:0> in data read, EXNOR circuits 3 and 5 operate as buffer circuits, so that data Qcmpf<7:0> of 8 bits the same in logic level as data TQf<7:0> read from this DRAM core is outputted. Therefore, even if a test is performed using the data bits of the respective memory cells, no problem occurs.

Further, in this case, by setting expected value data CMPD<7:0> in accordance with a write data pattern, it is possible to determine the pass/fail of each bit even after fuse programming to accurately determine whether the fail repair is performed. In this case, a multi-bit test result indication signal from the TIC data path may be directly employed.

As stated so far, according to the second embodiment of the present invention, the output signals of the unit processing circuits, which process the 8-bit data generated on the TIC data path in units of bits, are transferred to the tester through the flip-flop. Therefore, it is possible to dispense with a select circuit for selecting either of 8-bit data TQf<7:0> and the output signal Qcmpf<7:0> of the unit processing circuits and to reduce the layout area of the TIC control circuit.

[Third Embodiment]

FIG. 4 is a schematic diagram showing the configuration of a main portion of TIC control circuit 562 according to the third embodiment of the present invention. In the configuration of TIC control circuit 562 shown in FIG. 4, write data Df<7:0> is outputted from flip-flop 1*b* and expected value data CMPD<7:0> is generated by flip-flop 1*b* as well. The remaining configuration of the TIC control circuit shown in FIG. 4 is the same as that shown in FIG. 1, and corresponding parts are denoted by the same reference symbols and will not be described in detail.

In TIC control circuit 562 shown in FIG. 4, expected value data CMPD<7:0> is generated by flip-flops 1*a* and 1*b* of the two stages and applied to unit processing circuits UPK0 to UPK7. Therefore, it is possible to dispense with flip-flops 1*c* and 1*d* of the two stages to reduce the layout area of TIC control circuit 562.

With the configuration of TIC control circuit 562 shown in FIG. 4, read data is generated by DRAM macro and transmitted to the test interface circuit after elapse of 4 clock cycles since a data read instruction is applied. Therefore, in order to generate expected value data CMPD<7:0>, expected value data TD<7:0> is applied after elapse of 2 clocks since a read operation instructing signal is applied. That is, in the timing chart shown in FIG. 2, if data read instructing signal RE is taken in at the rising edge of test clock signal TCLK at time T11, expected value data is applied in the clock cycle starting at time T12.

[Modification]

Figure 5:
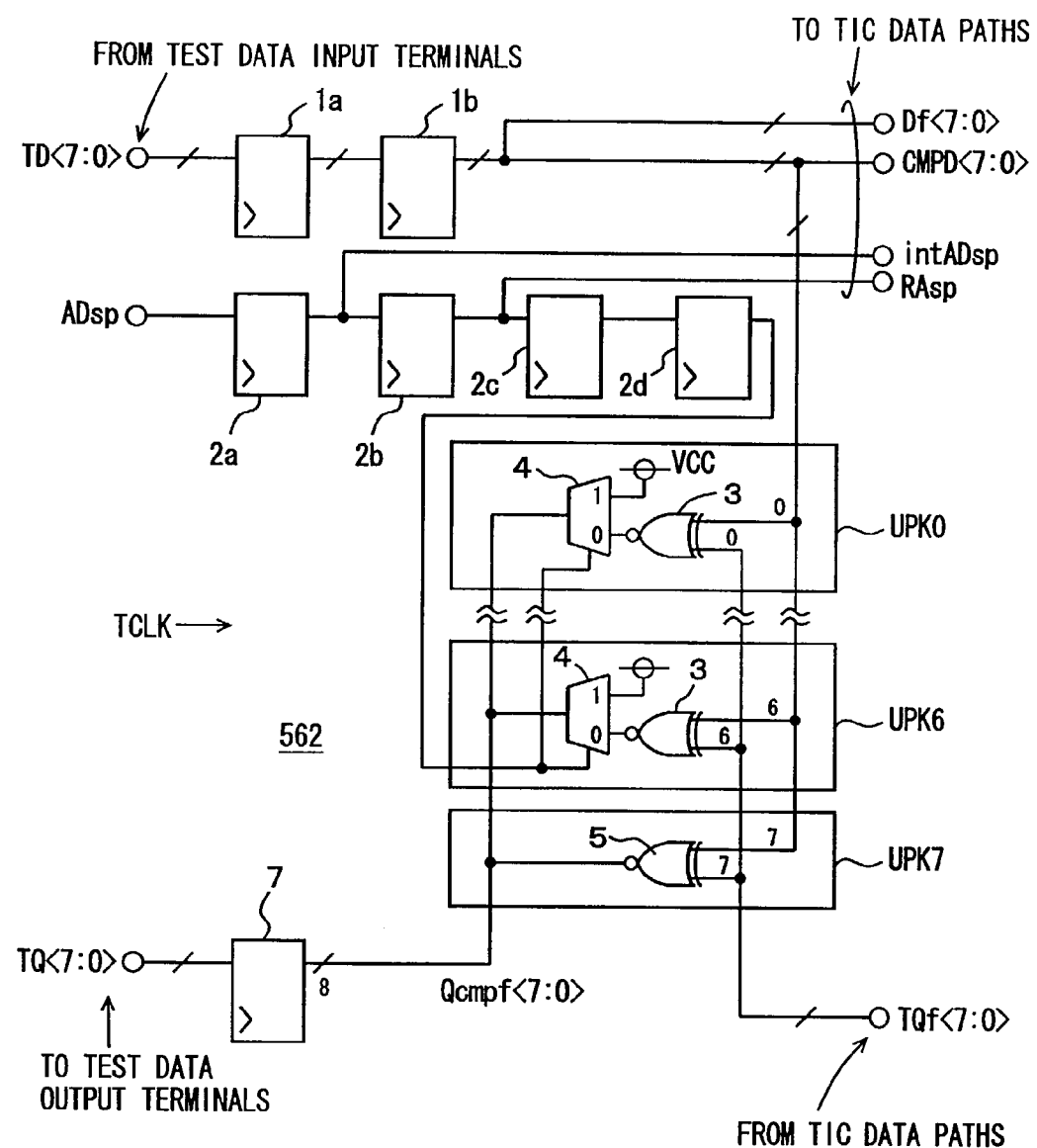
FIG. 5 show the configuration of a modification of the third embodiment of the present invention.

FIG. 5 is a schematic diagram showing the configuration of TIC control circuit 562 according to the modification of the third embodiment of the present invention. In TIC control circuit 562 shown in FIG. 5, output data Qcmpf<7:0> of unit processing circuits UPK0 to UPK7 is directly applied to flip-flop 7. That is, the configuration of TIC control circuit 562 shown in FIG. 5 is equivalent to the configuration of TIC control circuit 562 shown in FIG. 4 with select circuit 6 excluded. In this case, therefore, it is possible to dispense with select circuit 6 and flip-flops 1*c* and 1*d* of two stages and therefore, the layout area of TIC control circuit 562 can be further reduced.

As stated so far, according to the third embodiment of the present invention, the expected value data to be comparison bases for the test data is generated using the flip-flop which generates test write data, and a circuit layout area can be reduced.

[Fourth Embodiment]

Figure 6:
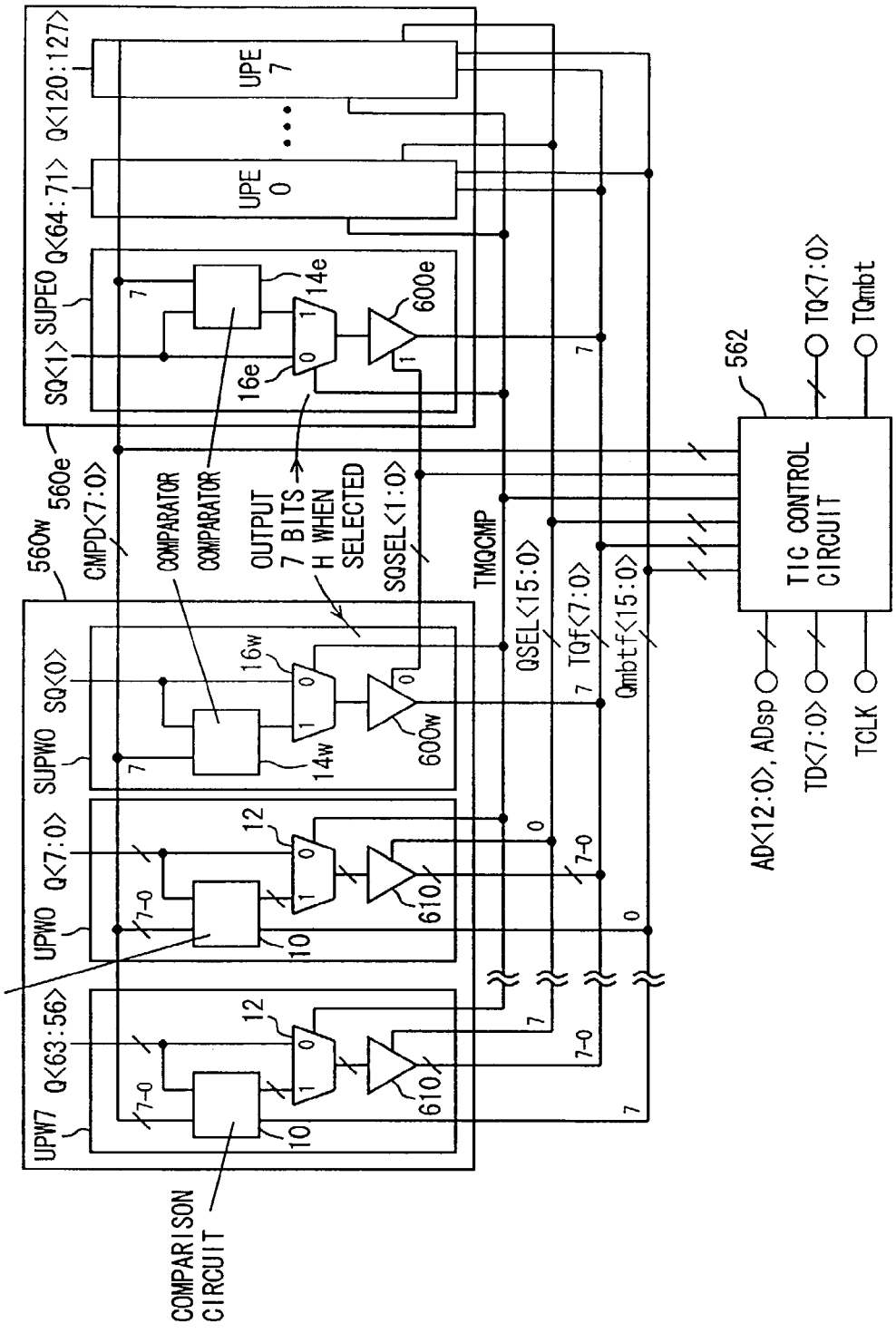
FIG. 6 is a schematic diagram showing the configurations of TIC data paths according to the fourth embodiment of the present invention.

FIG. 6 is a schematic diagram showing the configuration of TIC data paths arranged in a test interface circuit (TIC) according to the fourth embodiment of the present invention. In FIG. 6, TIC data path 560*w* includes a unit processing circuit SUPW0 provided for to spare data bit SQ<0> and unit processing circuits UPW0 to UPW7 provided for 8-bit data Q<7:0> to Q<63:56>, respectively.

Figure 21:
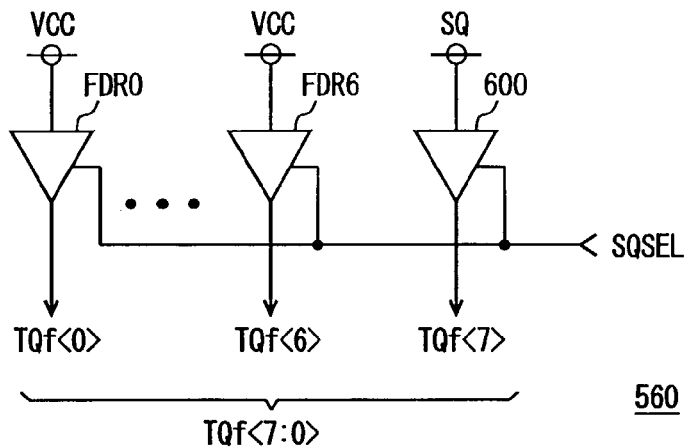
FIG. 21 is a schematic diagram showing the configuration of a part of the TIC data path shown in FIG. 18 corresponding to spare memory cells.

Unit processing circuit SUPW0 includes a comparator 14*w* which compares spare data bit SQ<0> with expected value data bit CMPD<7>, a selector 16*w* which selects one of the output signal of comparator 14*w* and spare data bit SQ<0> in accordance with test mode instructing signal TMQCMP, and tri-state buffer 600w which buffers and transfers the output signal of selector 16w in accordance with select signal SQSEL<0>. In unit processing circuit SUPW0, when select signal SQSEL<0> is activated, the data of remaining 7 bits are set at a fixed value (H level) and data TQF<7:0> of 8 bits is generated as in the case of the configuration shown in FIG. 21. A circuit for generating this fixed value is not shown for the simplification of the drawing.

Since unit processing circuits UPW0 to UPW7 have the common configuration, the corresponding constituent elements of unit processing circuits UPW0 to UPW7 are denoted by the same reference symbols. Each of unit processing circuits UPW0 to UPW7 includes a comparison circuit 10 which compares expected value data SMPD<7:0> with corresponding 8-bit data Q<8·n+7:8·n>, a select circuit 12 which selects either of the output data of comparison circuit 10 and corresponding 8-bit data Q<8·n+7:8·n>, and tri-state buffer circuit 610 which buffers the output signal of select circuit 12 and generates data TQf<7:0> of 8 bits in accordance with select signal QSEL<n>.

Comparison circuit 10 also includes a compression circuit which compresses the result of bit-by-bit comparison of expected value data CMPD<7:0> with corresponding data <8·n+1:8·n> to 1-bit data. The 1-bit compressed data from comparison circuit 10 is outputted as multi-bit test result indication signal Qmbtf<n>.

Likewise, TIC data path 560e includes a unit processing circuit SUPE0 provided for spare data bit SQ<1> and unit processing circuits UPE0 to UPE7 provided for 8-bit data Q<64:71> to Q<120:127>, respectively. Since unit processing circuits UPE0 to UPE7 have the same configuration as that of unit processing circuits UPW0 to UPW7, unit processing circuits UPE0 to UPE7 are indicated by blocks in FIG. 6.

Unit processing circuit SUPE0 includes a comparator 14e which compares spare data bit SQ<1> with expected data bit CMPD<7>, a selector 16e which selects either of spare data bit SQ<1> and the output signal of comparator 14e in accordance with test mode instructing signal TMQCMP, and tri-state buffer 600e which buffers and outputs the output signal of selector 16e in accordance with select signal SQSEL<1>.

In unit processing circuit SUPE0, a circuit which generates data of 7 bits each having a fixed value of H level to generate test read data TQf<7:0> of a total of 8 bits when select signal SQSEL<1> is in a selected state, is provided. The circuit configuration for generating the 8-bit data with 7 bits fixed is the same as that shown in FIG. 21.

TIC control circuit 562 transfers 8-bit data TQf<7:0> transferred from TIC data paths 560w and 560e synchronously with test clock signal TCLK and generates output data TQ<7:0>. In addition, TIC control circuit 562 compresses multi-bit test result indication signals Qmbtf<15:0> to 1-bit compressed signal TQmbt and transfers such compressed signal TQmbt in accordance with test clock signal TCLK. In this 1-bit compression operation, compression is performed by performing AND operation on multi-bit test result indication signals Qmbtf<15:0>. The configuration of this TIC control circuit 562 is the same as that of the conventional TIC control circuit. In this case, the multi-bit test result indicating signal Qmbtf<15;0> of 16 bits may be sequentially transferred concurrently with corresponding test data TQf<7:0> without compression.

According to the configuration of the test interface circuit shown in FIG. 6, in each of unit processing circuits UPW0 to UPW7 and UPE0 to UPE7 in the TIC data paths, the respective bits of memory cell data are compared with the corresponding bits of the expected value data for each 8-bit data and either of the 8-bit read data and the comparison result data is selected in accordance with test mode instructing signal TMQCMP.

In each of TIC data paths 560w and 560e shown in FIG. 6, comparison circuit 10 for a multi-bit test is used as a circuit for the comparison of the respective bits of the 8-bit data with the corresponding bits of the expected value data. That is, the output signal of 8-bit of comparison circuit 10 is data indicating the result of comparison between the respective bits of the memory cell data and corresponding data bits of the expected value data. Comparison circuit 10 and comparators 14w and 14e determine the pass/fail of memory cells. Therefore, it is unnecessary to arrange a comparison circuit for comparing the respective bits of the 8-bit data with the expected value data bits in TIC control circuit 562, making it possible to reduce the layout area of TIC control circuit 562.

Normally, data paths 560e and 560w have so many interconnection lines due to the control signals and data input/output signals. The layout area of each of data paths 560e and 560w is determined according to the interconnection and therefore, a space sufficient to arrange additional transistors exists in the data paths. For example, the comparison circuit of 8 bits and the tri-state buffer circuit of 8 bits are arranged for signal lines of 8 bits. In addition, signal lines for transmitting select signal QSEL<15:0> of 16 bits and select signal SQSEL<1:0> of 2 bits and interconnection lines for transmitting multi-bit test result indication signal Qmbtf<15:0> of 16 bits are arranged therein. Accordingly, in each of unit processing circuits UPW0 to UPW7 and UPE0 to UPE7, even if select circuit 12 which operates in accordance with test mode instructing signal TMQCMP is arranged between comparison circuit 10 and tri-state buffer 610, the layout area of the unit processing circuit does not increase.

Furthermore, in processing circuits SUPW0 and SUPE0 for processing spare data SQ<1:0>, it is necessary to additionally arrange comparators 14w and 14e, respectively. However, since each of comparators 14w and 14e is constituted of, for example, EXNOR circuits and can be arranged in a free region below interconnection lines, the layout areas of unit processing circuits SUPW0 and SUPE0 are not increased at all even by the arrangement of comparators 14w and 14e.

Therefore, by employing the configuration in which the respective bits of the 8-bit data are compared with the corresponding bits of the expected value data and the signals indicating the respective comparison results are outputted using comparison circuit 10 provided in each of TIC data paths 560w and 560e, it is unnecessary to arrange a comparison circuit in TIC control circuit 562, it is possible to suppress the increase of the layout area of TIC control circuit 562 and therefore, it is possible to suppress the increase of the area of the test interface circuit.

FIG. 7 shows an example of the configuration of comparison circuit 10 shown in FIG. 6. In FIG. 7, comparison circuit 10 includes an EXNOR gate 20a which receives a data bit Q<8n+7> and expected data bit CMP<7>, an EXNOR gate 20b which receives a memory cell data bit Q<8n+6> and expected value data bit CMPD<6>, an EXNOR gate 20c which receives a memory cell data bit Q<8n+5> and expected value data bit CMPD<5>, an EXNOR gate 20d which receives a memory cell data bit Q<8n+4> and expected value data bit CMPD<4>, an EXNOR gate 20e which receives a memory cell data bit Q<8n+3> and expected value data bit CMPD<3>, an EXNOR gate 20f which receives a memory cell data bit Q<8n+2> and expected value data bit CMPD<2>, an EXNOR gate 20g which receives a memory cell data bit Q<8n+1> and expected value data bit CMPD<1>, and an EXNOR gate 20h which receives a memory cell data bit Q<8n> and expected value data bit CMPD<0>.

Each of EXNOR gates 20a to 20h operates as a coincidence detection circuit which outputs an H-level signal if the logic levels of the corresponding data bits are coincident with each other.

Output data bits Qcmpdp<8n+7:8n> of EXNOR gates 20a to 20h are applied to corresponding select circuits 12, respectively.

Comparison circuit 10 further includes an AND gate 22 which receives the output signals of EXNOR gates 20a to 20h and generates multi-bit test result indication signal Qmbtf<n>. AND gate 22 sets multi-bit test result indication signal Qmbtf<n> at H level when all of the output signals of EXNOR gates 20a to 20h are at H level. Therefore, if memory cell data Q<8n+7:8n> of 8 bits differs from the expected value data bits even at one bit, the output signal of corresponding EXNOR gate attains L level and the output signal Qmbtf<n> of AND gate 22 responsively attains L level. The comparison result data of 8 bits is compressed to multi-bit test result indication signal Qmbtf<n> of 1 bit by AND gate 22.

It is noted that each of comparators 14w and 14e shown in FIG. 6 is constituted of one EXNOR gate.

In each of TIC data paths 560e and 560w shown in FIG. 6, select circuits 12 and selectors 16w or 16e may be omitted as in the case of the second embodiment. That is, the output signals of comparison circuits 10 and selectors 14e and 14w may be always selected and applied to TIC circuit 562. In this case, as in the case of the second embodiment, by setting the each bit of expected value data CMPD<7:0> at H level, it is possible to identify a read memory cell data pattern externally. With this configuration, it is only required to use the same configuration as that of the conventional data path and to arrange additional interconnection lines for leading out the respective output bits of comparison circuits 12. In addition, it is only required to provide additional comparators for spare bits SQ<1:0>. The layout of TIC data path can be, therefore, simplified.

As stated so far, according to the fourth embodiment of the present invention, each TIC data path is so constituted as to output the comparison results between 8-bit memory cell data bits and the respective expected value data bits. It is, therefore, unnecessary to arrange a comparison circuit which compares the data bits in the TIC control circuit and it is possible to reduce the layout area of the test interface circuit.

If a register which stores the expected value data when test data is read is arranged in the first to fourth embodiments, the test data output nodes and the test data input nodes may be made common.

Furthermore, in each of the first to fourth embodiments, the input/output pads of the test interface circuit may be connected to the pads of the logic device through a switching circuit and test dedicated pads may not be arranged.

Moreover, the DRAM core may operate in a DDR (double data rate) mode in which data is transferred synchronously with the rising and falling edges of the clock signal. In this case, in test interface circuit TIC, data transfer rate is changed from the double data rate into a single data rate for transferring data at either edge of the clock signal, and test data may be transferred synchronously with the rising edge of the test clock signal. Further, test interface circuit TIC may transfer test data synchronously with the test clock signal in the DDR mode. For conversion of the data transfer rate from the double data rate to the single data rate, two 8-bit data output sections are provided to alternately take in data transferred at the rising edge of the test clock signal and data transferred at the falling edge thereof, and are alternately connected to the test data output nodes synchronously with the rising edge of the test clock signal.

Further, the memory is not limited to DRAM, but may be a memory for which the number of effective data bits transferred by the test interface circuit differs between the transfer of spare memory cell data and the transfer of normal memory cell data.

Additionally, the number of spare data lines is not limited to one for 64-bit data lines, but may be one for 32-bit data lines, or may be the number other than one. As long as the condition that the number of effective data bits in a data transfer unit to a tester in a test differs between the transfer of spare memory cell data and the transfer of normal memory cell data is satisfied, the present invention is applicable.

As stated so far, according to the present invention, in the configuration in which the internal data bus having a large bit width is selected for each predetermined number of bits and test data is outputted to the test data terminals, the data bits indicating the comparison results between the respective expected data bits and the corresponding bits of a predetermined number are configured to be outputted in parallel to the test output terminals upon test data reading. Therefore, it is unnecessary to perform such comparison in an external tester, and it is possible to continuously test normal memory cells and spare memory cells to shorten test time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
test data output nodes arranged in a width of a plurality of bits;
an internal data bus, greater in bit width than said test data output nodes, for transferring internal data; and
test circuitry for comparing a predetermined number of bits of the internal data on said internal data bus with bits of test expected value data equal in bit width to said test data output nodes for each bit, and outputting data indicating respective comparison results to said test data output nodes in parallel, wherein
said test circuitry includes:
a select circuit for selecting the predetermined number of bits of said internal data in accordance with a test address signal; and
a comparison circuit for comparing the bits selected by said select circuit with the respective bits of said test expected value data, and transmitting data signals indicating the respective comparison results to said test data output nodes, in parallel.

2. The semiconductor integrated circuit device according to claim 1, wherein
said test circuitry further includes a switching circuit for selecting either of output data signals of said comparison circuit and said predetermined number of bits in accordance with a test mode instruction signal, for transmission to said test data output nodes.

3. The semiconductor integrated circuit device according to claim 1, wherein
said comparison circuit comprises a plurality of comparators, arranged corresponding to said predetermined number of bits of the internal data, respectively, each for comparing a corresponding internal data bit with a corresponding bit of said test expected value data, the plurality of comparators including a first comparator corresponding to one of the internal data bits, and second comparators respectively corresponding to the internal data bits other than the one of the internal data bits, and
said test circuitry further includes a plurality of selectors, arranged corresponding to the respective second comparators each for selecting either of an output signal of a corresponding comparator and a predetermined fixed value in accordance with an address region designation signal.

4. The semiconductor integrated circuit device according to claim 1, wherein said test circuitry further includes:
a first transfer circuit for transferring test data applied to data input nodes synchronously with a clock signal, and generating internal write data; and
a second transfer circuit for transferring an output signal of said first transfer circuit synchronously with said clock signal for a predetermined period, and generating said test expected value data.

5. The semiconductor integrated circuit device according to claim 1, wherein
said test circuitry further includes a transfer circuit for transferring test data applied to test input nodes synchronously with a clock signal, and generating internal write data, and
said transfer circuit generates said expected value data in accordance with the test data applied to the input nodes.

6. The semiconductor integrated circuit device according to claim 1, wherein
said comparison circuit includes a plurality of comparator circuits, arranged corresponding to sub-data buses each having a width of said predetermined number of bits of said internal data bus, respectively, each including a plurality of comparators for comparing the respective bits of the test expected value data having the width of said predetermined number of bits with internal data bits of corresponding sub-data buses, and
said test circuitry further includes a select and transfer circuit arranged corresponding to each of said plurality of comparator circuits, for selecting either of an output signal of a corresponding comparator circuit and the internal data bits of a corresponding sub-data bus in accordance with an operation mode instructing signal designating a specific operation mode and a test address signal, for transference to said test data output nodes.

7. The semiconductor integrated circuit device according to claim 6, wherein
said test circuitry further includes:
a plurality of compression circuits, arranged corresponding to said plurality of comparison circuits, respectively, each for compressing output signals of the comparators of a corresponding comparison circuit to a signal of one bit.

8. A semiconductor integrated circuit device comprising:
test data output nodes arranged in a width of a plurality of bits;
an internal data bus, greater in bit width than said test data output nodes, for transferring internal data;
test circuitry for comparing a predetermined number of bits of the internal data on said internal data bus with bits of test expected value data in bit width to said test data output nodes for each bit, and outputting data indicating respective comparison results to said test data output nodes in parallel; and
a memory coupled to said internal data bus and outputting said internal data, said memory including a spare column for repairing a fail memory cell, and a spare data line for transferring data of said spare column, wherein
said internal data bus includes a spare data bus for transferring the data outputted onto said spare data line, and
said test circuitry includes:
a spare data group generation circuit for generating data of said predetermined number of bits by the data of said spare data bus and a fixed value data;
a comparator for comparing the spare data with an expected value data;
a switching circuit, arranged corresponding to each respective bit of said fixed value data, for outputting the fixed value data bit in accordance with an operation mode instructing signal; and
a transfer circuit for transferring an output signal of said comparator and an output signal of said switching circuit to said test data output nodes in parallel.

9. A semiconductor integrated circuit device comprising:
test data output nodes arranged in a width of a plurality of bits;
an internal data bus, greater in bit width than said test data output nodes, for transferring internal data;
test circuitry for comparing a predetermined number of bits of the internal data on said internal data bus with bits of test expected value data equal in bit width to said test data output nodes for each bit, and outputting data indicating respective comparison results to said test data output nodes in parallel; and
a memory coupled to said internal data bus, said memory including a spare column for repairing a fail memory cell, spare cell data read onto said spare column in accordance with an address signal being transferred to said internal data bus in a test, wherein
said test circuitry includes:
a comparison circuit for comparing said spare cell data with expected value data;
a select circuit for selectively transferring either of an output signal of said comparison circuit and said spare cell data in accordance with an operation mode instructing signal;
a circuit for generating fixed value data; and
a circuit for selecting an output signal of said select circuit and said fixed value data in accordance with a further address signal for transference to said test data output nodes in parallel.

* * * * *

UNITED STATES PATENT AND TRADEMARK OFFICE
CERTIFICATE OF CORRECTION

PATENT NO. : 7,047,461 B2 Page 1 of 1
APPLICATION NO. : 10/322676
DATED : May 16, 2006
INVENTOR(S) : Akira Yamazaki et al.

It is certified that error appears in the above-identified patent and that said Letters Patent is hereby corrected as shown below:

On the Title Page

Item "(30) Foreign Application Priority Data", change "2001-387388" to -- 2001-387338 --

Signed and Sealed this

Twenty-fourth Day of October, 2006

JON W. DUDAS
*Director of the United States Patent and Trademark Office*